(12) United States Patent
Bonney

(10) Patent No.: US 11,175,586 B2
(45) Date of Patent: Nov. 16, 2021

(54) PLATEWASH COMPOSITION

(71) Applicant: NSX Operating Co. LLC, Atlanta, GA (US)

(72) Inventor: Jon-Eric Bonney, Atlanta, GA (US)

(73) Assignee: NSX MANAGEMEN T GROUP, LLC, Atlanta, GA (US)

( * ) Notice: Subject to any disclaimer, the term of this patent is extended or adjusted under 35 U.S.C. 154(b) by 260 days.

(21) Appl. No.: 15/987,763

(22) Filed: May 23, 2018

(65) Prior Publication Data

US 2018/0341178 A1  Nov. 29, 2018

Related U.S. Application Data

(60) Provisional application No. 62/511,637, filed on May 26, 2017.

(51) Int. Cl.
*G03F 7/32* (2006.01)

(52) U.S. Cl.
CPC .................... *G03F 7/325* (2013.01)

(58) Field of Classification Search
CPC ........................................ G03F 7/325
See application file for complete search history.

(56) References Cited

U.S. PATENT DOCUMENTS

| 4,806,452 | A |  | 2/1989 | Hoffmann et al. |  |
|---|---|---|---|---|---|
| 4,847,182 | A |  | 7/1989 | Worns et al. |  |
| 5,049,646 | A |  | 9/1991 | Tyagi et al. |  |
| 5,077,177 | A |  | 12/1991 | Frass et al. |  |
| 5,128,234 | A | * | 7/1992 | Telser | G03F 7/325 430/306 |
| 5,240,815 | A | * | 8/1993 | Telser | G03F 7/325 430/306 |
| 5,252,432 | A | * | 10/1993 | Bach | G03F 7/325 430/306 |
| 5,312,719 | A |  | 5/1994 | Schlosser et al. |  |

(Continued)

FOREIGN PATENT DOCUMENTS

CA       1336238 C  *  7/1995  ............. G03F 7/325

OTHER PUBLICATIONS

Isoparaffin Chemical Formula. ISOPAR L. Parchem.com. 2019. (Year: 2019).*

(Continued)

*Primary Examiner* — Nicole M. Buie-Hatcher
*Assistant Examiner* — M. R. Asdjodi
(74) *Attorney, Agent, or Firm* — Ballard Spahr LLP

(57) ABSTRACT

This invention relates to a composition comprising a hydrocarbon solvent in combination with diisopropylbenzene or 2-ethylhexyl acetate, and optionally, a co-solvent selected from tetrahydrofurfuryl alcohol, 2-ethoxyethanol, terpineol, dipropylene glycol methyl ether, 2-butoxyethanol, 2-(2-butyoxyethoxy) ethanol, a naphthenic hydrocarbon, a paraffinic hydrocarbon, an olefinic hydrocarbon, an isoparaffinic hydrocarbon, a terepene, benzyl alcohol, cyclohexanol, methyl cyclohexanol, hexyl alcohol, and heptyl alcohol, and methods directed to the preparation and use of this composition. This abstract is intended as a scanning tool for purposes of searching in the particular art and is not intended to be limiting of the present invention.

15 Claims, 23 Drawing Sheets

(56) References Cited

U.S. PATENT DOCUMENTS

| | | | |
|---|---|---|---|
| 5,354,645 A * | 10/1994 | Schober | G03F 7/325 |
| | | | 430/306 |
| 5,578,420 A | 11/1996 | Takagi et al. | |
| 5,863,959 A | 1/1999 | Heyman et al. | |
| 5,981,787 A | 11/1999 | Sanchez et al. | |
| 6,084,059 A | 7/2000 | Matsushita et al. | |
| 6,162,593 A * | 12/2000 | Wyatt | G03F 7/325 |
| | | | 430/331 |
| 6,682,877 B2 | 1/2004 | Wyatt et al. | |
| 8,771,925 B2 * | 7/2014 | Fohrenkamm | G03F 7/325 |
| | | | 430/306 |
| 2003/0030030 A1 | 2/2003 | Sahbari | |
| 2006/0263611 A1 * | 11/2006 | Weberg | A47B 77/022 |
| | | | 428/443 |
| 2010/0068651 A1 | 3/2010 | Bradford | |
| 2011/0183260 A1 * | 7/2011 | Fohrenkamm | G03F 7/325 |
| | | | 430/270.1 |
| 2012/0100489 A1 * | 4/2012 | Hackler | G03F 7/3092 |
| | | | 430/493 |
| 2012/0308935 A1 * | 12/2012 | Fohrenkamm | G03F 7/325 |
| | | | 430/306 |
| 2013/0242276 A1 | 9/2013 | Schadebrodt et al. | |
| 2014/0308593 A1 | 10/2014 | Yabe | |
| 2014/0312268 A1 | 10/2014 | Lim | |
| 2015/0021587 A1 * | 1/2015 | Mizukami | C08G 73/024 |
| | | | 257/40 |
| 2018/0341178 A1 * | 11/2018 | Bonney | G03F 7/325 |

OTHER PUBLICATIONS

U.S. Appl. No. 62/041,010, filed Aug. 22, 2014, Jon-Eric Bonney (NSX Operating Co., LLC).

U.S. Appl. No. 14/832,667, filed Aug. 21, 2015, Jon-Eric Bonney (NSX Operating Co., LLC), (now U.S. Pat. No. 9,897,921), (published Feb. 20, 2018).

U.S. Appl. No. 14/833,894, filed Aug. 24, 2015, Jon-Eric Bonney (NSX Operating Co., LLC), (2016/0054657), (Feb. 25, 2016).

U.S. Appl. No. 15/899,282, filed Feb. 19, 2018, Jon-Eric Bonney (NSX Operating Co., LLC), (2018/0173097), (Jun. 21, 2018).

U.S. Appl. No. 62/511,637, filed May 26, 2017, Jon-Eric Bonney (NSX Operating Co., LLC).

Non Final Rejection dated Sep. 5, 2019 by the USPTO for U.S. Appl. No. 15/899,282, filed Feb. 19, 2018 and published as US 2018/0173097 A1 on Jun. 21, 2018 (Inventor—Jon-Eric Bonney) (9 Pages).

Restriction Requirement dated Apr. 27, 2016 by the U.S. Patent and Trademark Office for U.S. Appl. No. 14/832,667, filed Aug. 21, 2015 now U.S. Pat. No. 9,897,921 on Feb. 20, 2018 (Inventor—Jon-Eric Bonney; Applicant—NSX Operating Co., LLC;) (6 pages).

Response to Restriction Requirement filed on Jun. 7, 2016 with the U.S. Patent and Trademark Office for U.S. Appl. No. 14/832,667, filed Aug. 21, 2015 now U.S. Pat. No. 9,897,921 on Feb. 20, 2018 (Inventor—Jon-Eric Bonney; Applicant—NSX Operating Co., LLC;) (6 pages).

Non-Final Office Action dated Jul. 1, 2016 by the U.S. Patent and Trademark Office for U.S. Appl. No. 14/832,667, filed Aug. 21, 2015 now U.S. Pat. No. 9,897,921 on Feb. 20, 2018 (Inventor—Jon-Eric Bonney; Applicant—NSX Operating Co., LLC;) (8 pages).

Response to Non-Final Office Action filed on Nov. 15, 2016 with the U.S. Patent and Trademark Office for U.S. Appl. No. 14/832,667, filed Aug. 21, 2015 now U.S. Pat. No. 9,897,921 on Feb. 20, 2018 (Inventor—Jon-Eric Bonney; Applicant—NSX Operating Co., LLC;) (11 pages).

Final Office Action dated Feb. 9, 2017 by the U.S. Patent and Trademark Office for U.S. Appl. No. 14/832,667, filed Aug. 21, 2015 now U.S. Pat. No. 9,897,921 on Feb. 20, 2018 (Inventor—Jon-Eric Bonney; Applicant—NSX Operating Co., LLC;) (8 pages).

Response to Final Office Action filed on May 23, 2017 with the U.S. Patent and Trademark Office for U.S. Appl. No. 14/832,667, filed Aug. 21, 2015 now U.S. Pat. No. 9,897,921 on Feb. 20, 2018 (Inventor—Jon-Eric Bonney; Applicant—NSX Operating Co., LLC;) (17 pages).

Non-Final Office Action dated Jul. 14, 2017 by the U.S. Patent and Trademark Office for U.S. Appl. No. 14/832,667, filed Aug. 21, 2015 now U.S. Pat. No. 9,897,921 on Feb. 20, 2018 (Inventor—Jon-Eric Bonney; Applicant—NSX Operating Co., LLC;) (8 pages).

Response to Non-Final Office Action filed on Oct. 11, 2017 by the U.S. Patent and Trademark Office for U.S. Appl. No. 14/832,667, filed Aug. 21, 2015 now U.S. Pat. No. 9,897,921 on Feb. 20, 2018 (Inventor—Jon-Eric Bonney; Applicant—NSX Operating Co., LLC;) (9 pages).

Notice of Allowance dated Dec. 27, 2017 by the U.S. Patent and Trademark Office for U.S. Appl. No. 14/832,667, filed Aug. 21, 2015 now U.S. Pat. No. 9,897,921 on Feb. 20, 2018 (Inventor—Jon-Eric Bonney; Applicant—NSX Operating Co., LLC;) (7 pages).

Issue Notification dated Jan. 31, 2018 by the U.S. Patent and Trademark Office for U.S. Appl. No. 14/832,667, filed Aug. 21, 2015 now U.S. Pat. No. 9,897,921 on Feb. 20, 2018 (Inventor—Jon-Eric Bonney; Applicant—NSX Operating Co., LLC;) (1 page).

Notice of Abandonment dated Mar. 28, 2016 by the U.S. Patent and Trademark Office for U.S. Appl. No. 14/833,894, filed Aug. 24, 2015 (Inventor—Jon-Eric Bonney; Applicant—NSX Operating Co., LLC;) (2 pages).

\* cited by examiner

PLATEWASH COMPOSITION

CROSS REFERENCE TO RELATED APPLICATIONS

This Application claims the benefit of priority to U.S. Provisional Application No. 62/511,637, filed on May 26, 2017, the contents of which is incorporated herein by reference in its entirety.

BACKGROUND

Flexography is a type of relief printing that uses flexible sheets of photopolymer to transfer an image onto a substrate. In the flexography process, photopolymer sheet is exposed to light through a negative or mask that blocks selected portions of the photopolymer from the light. The portions of the photopolymer that are exposed to ultra-violet light crosslink. The non-crosslinked photopolymer is soluble in many organic solvents, whereas the crosslinked photopolymer is harder and much more resistant to chemical solvent attack. By "washing" the selectively-exposed photopolymer sheet in a solvent bath, the unexposed portions of the plate are removed, a process known as developing. The resulting developed plate will contain a raised relief image in those areas where ultra-violet light passed through the negative. The flexible relief plate is wrapped around a cylinder on a printing press, and used to transfer ink onto a substrate, such as paper, film, bags, etc.

Platewash solvents are exceptionally expensive and thus warrant recycling over disposal and purchasing of new platewash. Plate making processors are traditionally piped directly to a distillation unit, allowing the recycled platewash to be drawn directly from the unit into the processor. It is therefore imperative that the recycled platewash be uniform in its composition throughout the duration of the distillation cycle, as is new platewash.

To ensure a uniform chemical composition during the recycling process, the boiling points of each of the chemicals would preferably be as close to one another as possible. However, this may not be possible as hydrocarbon solvents, which are commonly used in flexographic platewash, do not have a single boiling point. Rather hydrocarbon solvents have a boiling point range. The introduction of a solvent with a boiling point range into the platewash formulation can easily skew the conformity of the solvent during the distillation. Thus, there remains a need for platewash formulations that distill uniformly and are stable throughout the platemaking and recycling processes.

SUMMARY

In accordance with the purpose(s) of the invention, as embodied and broadly described herein, the invention, in one aspect, relates to compositions comprising 2-ethylhexyl acetate or diisopropylbenzene, and a hydrocarbon solvent, and methods of making and using same.

Disclosed are compositions comprising: (a) 2-ethylhexyl acetate or diisopropylbenzene; (b) a hydrocarbon solvent having an average boiling point of from about 200° C. to about 211° C. at 1 atm; and (c) optionally, a co-solvent selected from tetrahydrofurfuryl alcohol, 2-ethoxyethanol, terpineol, dipropylene glycol methyl ether, 2-butoxyethanol, 2-(2-butyoxyethoxy) ethanol, a naphthenic hydrocarbon, a paraffinic hydrocarbon, an olefinic hydrocarbon, an isoparaffinic hydrocarbon, a terepene, benzyl alcohol, cyclohexanol, methyl cyclohexanol, hexyl alcohol, and heptyl alcohol.

Also disclosed are compositions comprising: (a) a hydrocarbon solvent having an average boiling point; (b) an alcohol having a boiling point within less than ±2% of the average boiling point of the hydrocarbon solvent at 1 atm; and (c) 2-ethylhexyl acetate or diisopropylbenzene.

Also disclosed are compositions comprising: (a) an alcohol having a boiling point; (b) 2-ethylhexyl acetate or diisopropylbenzene; and (c) a hydrocarbon solvent having an average boiling point within less than ±3% of the boiling point of the alcohol at 1 atm.

Also disclosed are compositions having a 50% volume temperature, wherein the composition comprises: (a) a hydrocarbon solvent having a 50% volume temperature within less than ±2% of the 50% volume temperature of the composition; (b) diisopropylbenzene or 2-ethylhexyl acetate; and (c) optionally, a co-solvent selected from tetrahydrofurfuryl alcohol, 2-ethoxyethanol, terpineol, dipropylene glycol methyl ether, 2-butoxyethanol, 2-(2-butyoxyethoxy) ethanol, a naphthenic hydrocarbon, a paraffinic hydrocarbon, an olefinic hydrocarbon, an isoparaffinic hydrocarbon, a terepene, benzyl alcohol, cyclohexanol, methyl cyclohexanol, hexyl alcohol, and heptyl alcohol.

Also disclosed are compositions having a 50% volume temperature, wherein the composition comprises: (a) a hydrocarbon solvent; (b) diisopropylbenzene or 2-ethylhexyl acetate; and (c) an alcohol having a 50% volume temperature within less than ±2% of the 50% volume temperature of the composition.

Also disclosed are compositions having a 50% volume temperature, wherein the composition comprises: (a) a hydrocarbon solvent having a 50% volume temperature within less than ±2% of the 50% volume temperature of the composition and an average boiling point within less than ±3% of the boiling point of the alcohol at 1 atm; (b) diisopropylbenzene or 2-ethylhexyl acetate; and (c) an alcohol having a 50% volume temperature within less than ±2% of the 50% volume temperature of the composition and a boiling point within less than ±2% of the average boiling point of the hydrocarbon solvent at 1 atm.

Also disclosed are methods for making the disclosed compositions.

Also disclosed are purification methods comprising the steps of: (a) vaporizing a disclosed composition, thereby making a vapor; and (b) condensing the vapor.

Also disclosed are purification methods comprising distilling a disclosed composition, wherein the distilled composition comprises the same components in substantially the same proportions as the undistilled composition.

Also disclosed are compositions comprising benzyl alcohol, 2-ethylhexyl acetate or diisopropylbenzene, and a hydrocarbon solvent, wherein the hydrocarbon solvent has a boiling point range of from about 190° C. to about 215° C.

Also disclosed are products of the disclosed methods.

Additional advantages of the invention will be set forth in part in the description which follows, and in part will be obvious from the description, or can be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE DRAWINGS

The accompanying figures, which are incorporated in and constitute a part of this specification, illustrate several aspects and together with the description serve to explain the principles of the invention.

Figure 1:
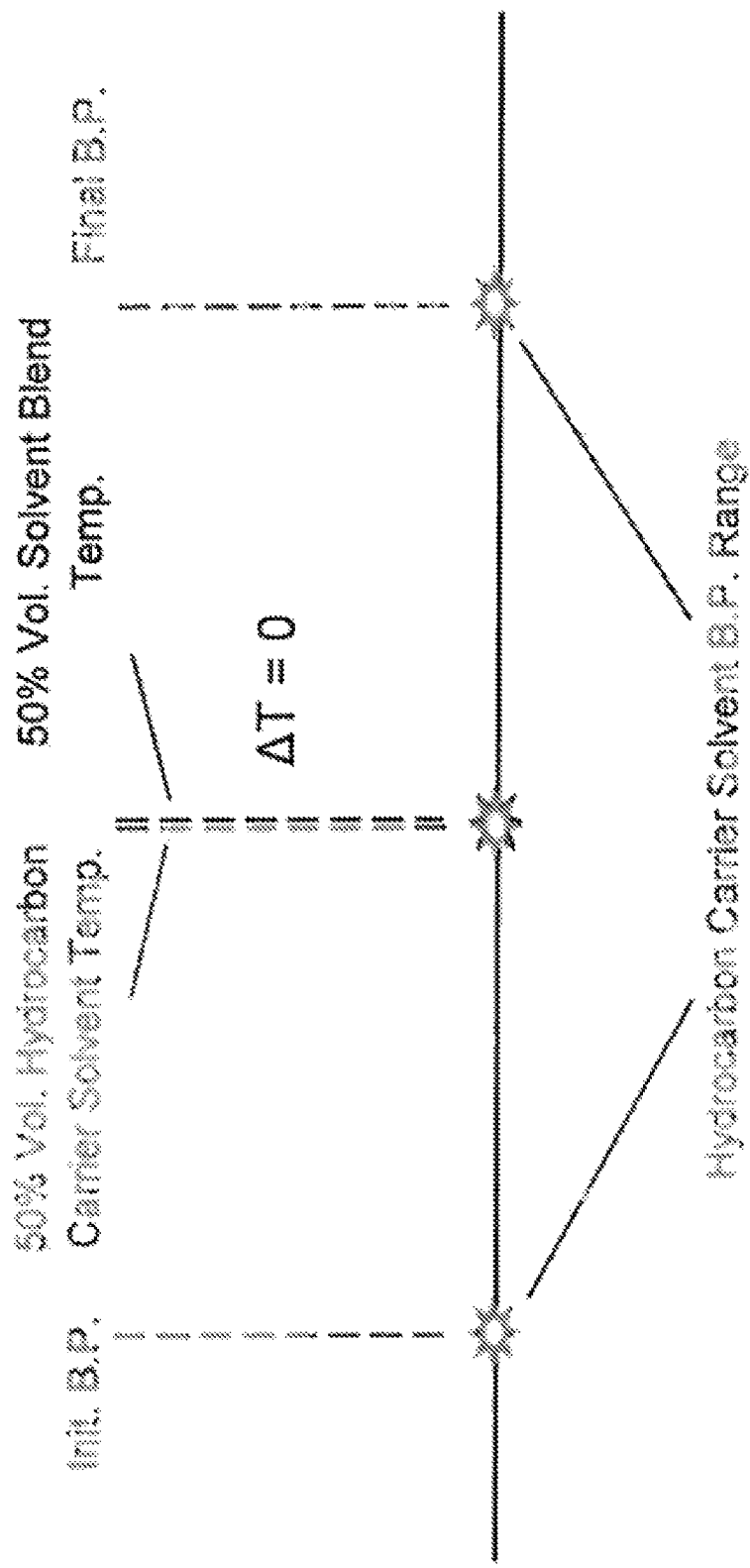
FIG. 1 shows a representative image of a preferred solvent blend.

Additional advantages of the invention will be set forth in part in the description which follows, and in part will be obvious from the description, or can be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DETAILED DESCRIPTION

The present invention can be understood more readily by reference to the following detailed description of the invention and the Examples included therein.

Before the present compounds, compositions, articles, systems, devices, and/or methods are disclosed and described, it is to be understood that they are not limited to specific synthetic methods unless otherwise specified, or to particular reagents unless otherwise specified, as such may, of course, vary. It is also to be understood that the terminology used herein is for the purpose of describing particular aspects only and is not intended to be limiting. Although any methods and materials similar or equivalent to those described herein can be used in the practice or testing of the present invention, example methods and materials are now described.

While aspects of the present invention can be described and claimed in a particular statutory class, such as the system statutory class, this is for convenience only and one of skill in the art will understand that each aspect of the present invention can be described and claimed in any statutory class. Unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

Throughout this application, various publications are referenced. The disclosures of these publications in their entireties are hereby incorporated by reference into this application in order to more fully describe the state of the art to which this pertains. The references disclosed are also individually and specifically incorporated by reference herein for the material contained in them that is discussed in the sentence in which the reference is relied upon. Nothing herein is to be construed as an admission that the present invention is not entitled to antedate such publication by virtue of prior invention. Further, the dates of publication provided herein may be different from the actual publication dates, which can require independent confirmation.

A. Definitions

As used in the specification and the appended claims, the singular forms "a," "an" and "the" include plural referents unless the context clearly dictates otherwise. Thus, for example, reference to "a functional group," "an alkyl," or "a residue" includes mixtures of two or more such functional groups, alkyls, or residues, and the like.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

References in the specification and concluding claims to parts by weight of a particular element or component in a composition denotes the weight relationship between the element or component and any other elements or components in the composition or article for which a part by weight is expressed. Thus, in a compound containing 2 parts by weight of component X and 5 parts by weight component Y, X and Y are present at a weight ratio of 2:5, and are present in such ratio regardless of whether additional components are contained in the compound.

A weight percent (wt. %) of a component, unless specifically stated to the contrary, is based on the total weight of the formulation or composition in which the component is included.

As used herein, the terms "optional" or "optionally" means that the subsequently described event or circumstance can or cannot occur, and that the description includes instances where said event or circumstance occurs and instances where it does not.

As used herein, the term "consists essentially of" means excluding other materials that materially affect the basic and novel properties of the claimed invention. Thus, a composition that consists essentially of a hydrocarbon solvent, a co-solvent, and diisopropylbenzene or 2-ethylhexyl acetate is made up of the specified materials and, optionally, additional materials that do not materially affect the basic and novel characteristics of the claimed composition. It is recognized, however, that any material affecting the basic and novel properties of the claimed invention may yet be present in trace amounts. For example, such material may be present in less than 10%, less than 5%, less than 1%, less than 0.1%, less than 0.01%, or less than 0.001%.

As used herein, the term "average boiling point" refers to the mean boiling temperature of a liquid mixture taken over the entire boiling range of that liquid mixture. In one aspect, the average boiling point can also be referred to as the weight-averaged boiling temperature. It is recognized that when referring to a substance comprising a single component (e.g., benzyl alcohol) that the boiling point can consist of a single value. In this case, the average boiling point and the boiling point are the same.

As used herein, the term "50% volume temperature" refers to the temperature of a substance when the liquid volume of the substance has been reduced by half due to heating. For example, the liquid volume of a substance prior to heating is 100 mL. As the substance is heated, the liquid volume begins to decrease. The 50% volume temperature would be the temperature at which the liquid volume has been decreased by half. It is recognized that when referring to a substance comprising a single component (e.g., benzyl alcohol) that the 50% volume temperature and the boiling point are the same.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; and the number or type of embodiments described in the specification.

It is understood that the compositions disclosed herein have certain functions. Disclosed herein are certain structural requirements for performing the disclosed functions, and it is understood that there are a variety of structures that can perform the same function that are related to the disclosed structures, and that these structures will typically achieve the same result.

B. Compositions

In one aspect, disclosed are compositions comprising: (a) 2-ethylhexyl acetate or diisopropylbenzene; (b) a hydrocarbon solvent having an average boiling point of from about 200° C. to about 211° C. at 1 atm; and (c) optionally, a co-solvent selected from tetrahydrofurfuryl alcohol, 2-ethoxyethanol, terpineol, dipropylene glycol methyl ether, 2-butoxyethanol, 2-(2-butyoxyethoxy) ethanol, a naphthenic hydrocarbon, a paraffinic hydrocarbon, an olefinic hydrocarbon, an isoparaffinic hydrocarbon, a terpene, benzyl alcohol, cyclohexanol, methyl cyclohexanol, hexyl alcohol, and heptyl alcohol.

In one aspect, disclosed are compositions comprising: (a) a hydrocarbon solvent having an average boiling point; (b) an alcohol having a boiling point within less than ±2% of the average boiling point of the hydrocarbon solvent at 1 atm; and (c) 2-ethylhexyl acetate or diisopropylbenzene.

In one aspect, disclosed are compositions comprising: (a) an alcohol having a boiling point; (b) 2-ethylhexyl acetate or diisopropylbenzene; and (c) a hydrocarbon solvent having an average boiling point within less than ±3% of the boiling point of the alcohol at 1 atm.

In one aspect, disclosed are compositions comprising benzyl alcohol, 2-ethylhexyl acetate or diisopropylbenzene, and a hydrocarbon solvent, wherein the hydrocarbon solvent has a boiling point range of from about 190° C. to about 215° C.

In one aspect, disclosed are compositions having a 50% volume temperature, wherein the composition comprises: (a) a hydrocarbon solvent having a 50% volume temperature within less than ±2% of the 50% volume temperature of the composition; (b) diisopropylbenzene or 2-ethylhexyl acetate; and (c) optionally, a co-solvent selected from tetrahydrofurfuryl alcohol, 2-ethoxyethanol, terpineol, dipropylene glycol methyl ether, 2-butoxyethanol, 2-(2-butyoxyethoxy) ethanol, a naphthenic hydrocarbon, a paraffinic hydrocarbon, an olefinic hydrocarbon, an isoparaffinic hydrocarbon, a terpene, benzyl alcohol, cyclohexanol, methyl cyclohexanol, hexyl alcohol, and heptyl alcohol.

In one aspect, disclosed are compositions having a 50% volume temperature, wherein the composition comprises: (a) a hydrocarbon solvent; (b) diisopropylbenzene or 2-ethylhexyl acetate; and (c) an alcohol having a 50% volume temperature within less than ±2% of the 50% volume temperature of the composition.

In one aspect, disclosed are compositions having a 50% volume temperature, wherein the composition comprises: (a) a hydrocarbon solvent having a 50% volume temperature within less than ±2% of the 50% volume temperature of the composition and an average boiling point within less than ±3% of the boiling point of the alcohol at 1 atm; (b) diisopropylbenzene or 2-ethylhexyl acetate; and (c) an alcohol having a 50% volume temperature within less than ±2% of the 50% volume temperature of the composition and a boiling point within less than ±2% of the average boiling point of the hydrocarbon solvent at 1 atm.

In a further aspect, the composition consists essentially of diisopropylbenzene and the hydrocarbon solvent. In a still further aspect, the composition consists essentially of the hydrocarbon solvent, diisopropylbenzene, and the co-solvent. In yet a further aspect, the composition consists essentially of the hydrocarbon solvent, diisopropylbenzene, and benzyl alcohol.

In a further aspect, the composition consists essentially of 2-ethylhexyl acetate and the hydrocarbon solvent. In a still further aspect, the composition consists essentially of the hydrocarbon solvent, 2-ethylhexyl acetate, and the co-solvent. In yet a further aspect, the composition consists essentially of the hydrocarbon solvent, 2-ethylhexyl acetate, and benzyl alcohol.

In a further aspect, the composition comprises less than about 35 wt % co-solvent, of from about 10 wt % to about 90 wt % diisopropylbenzene or 2-ethylhexyl acetate, and from about 10 wt % to about 60 wt % hydrocarbon solvent. In a still further aspect, the composition comprises less than about 30 wt % co-solvent, of from about 20 wt % to about 70 wt % diisopropylbenzene or 2-ethylhexyl acetate, and from about 20 wt % to about 55 wt % hydrocarbon solvent. In yet a further aspect, the composition comprises less than about 30 wt % co-solvent, of from about 20 wt % to about 50 wt % diisopropylbenzene or 2-ethylhexyl acetate, and from about 40 wt % to about 55 wt % hydrocarbon solvent. In an even further aspect, the composition comprises less than about 30 wt % co-solvent, of from about 20 wt % to about 30 wt % diisopropylbenzene or 2-ethylhexyl acetate, and from about 49 wt % to about 52 wt % hydrocarbon solvent. In a still further aspect, the co-solvent is an alcohol. In yet a further aspect, the co-solvent is selected from cyclohexanol and benzyl alcohol. In an even further aspect, the co-solvent is benzyl alcohol.

In a further aspect, the composition comprises about 20 wt % co-solvent, about 28 wt % diisopropylbenzene or 2-ethylhexyl acetate, and of from about 45 wt % to about 50 wt % hydrocarbon solvent. In a still further aspect, the composition comprises about 25 wt % co-solvent, about 25 wt % diisopropylbenzene or 2-ethylhexyl acetate, and about 50 wt % hydrocarbon solvent. In a further aspect, the co-solvent is an alcohol. In a still further aspect, the co-solvent is selected from cyclohexanol and benzyl alcohol. In yet a further aspect, the co-solvent is benzyl alcohol.

In a further aspect, the composition comprises about 20 wt % benzyl alcohol, about 28 wt % diisopropylbenzene or 2-ethylhexyl acetate, and of from about 45 wt % to about 50 wt % hydrocarbon solvent. In a still further aspect, the composition comprises about 25 wt % benzyl alcohol, about 25 wt % diisopropylbenzene or 2-ethylhexyl acetate, and about 50 wt % hydrocarbon solvent.

In a further aspect, the composition comprises about 80 wt % diisopropylbenzene or 2-ethylhexyl acetate, and about 20 wt % hydrocarbon solvent.

In a further aspect, the composition further comprises an alcohol.

1. Hydrocarbon Solvents

In one aspect, the compositions comprise a hydrocarbon solvent having an average boiling point. In a further aspect, the average boiling point is of from about 200° C. to about 211° C. at 1 atm. In a still further aspect, the average boiling is within less than ±3% of the boiling point of the alcohol at 1 atm.

In one aspect, the composition comprises a hydrocarbon solvent having a 50% volume temperature within less than ±2% of the 50% volume temperature of the composition. In a further aspect, the hydrocarbon solvent has a 50% volume temperature within less than ±1.5% of the 50% volume temperature of the composition. In a still further aspect, the hydrocarbon solvent has a 50% volume temperature within less than ±1% of the 50% volume temperature of the composition. In yet a further aspect, the hydrocarbon solvent has a 50% volume temperature within less than ±0.5% of the 50% volume temperature of the composition.

In one aspect, the composition comprises a hydrocarbon solvent having a 50% volume temperature within less than ±2% of the 50% volume temperature of the composition and an average boiling point within less than ±3% of the boiling point of the alcohol at 1 atm. In a further aspect, the composition comprises a hydrocarbon solvent having a 50% volume temperature within less than ±1% of the 50% volume temperature of the composition and an average boiling point within less than ±2% of the boiling point of the alcohol at 1 atm. In a still further aspect, the composition comprises a hydrocarbon solvent having a 50% volume temperature within less than ±1% of the 50% volume temperature of the composition and an average boiling point within less than ±1% of the boiling point of the alcohol at 1 atm.

In various aspects, the hydrocarbon solvent consists essentially of paraffinic components with a low naphthenic and aromatic content. Examples of hydrocarbon solvents include, but are not limited to, GTL GS 190, GTL GS 215, GTL GS 250, GTL GS 270, GTL GS 310, GTL GS 1927, and GTL GS 2735.

In various aspects, the hydrocarbon solvent is essentially odorless.

In various aspects, the hydrocarbon solvent is essentially free of sulphur, olefins, and aromatics. In a further aspect, the hydrocarbon solvent contains only trace amounts of sulphur, olefins, and aromatics.

In a further aspect, the hydrocarbon solvent comprises C4-C36 branched and linear alkanes. In a still further aspect, the hydrocarbon solvent comprises C8-C36 branched and linear alkanes. In yet a further aspect, the hydrocarbon solvent comprises C12-C36 branched and linear alkanes. In an even further aspect, the hydrocarbon solvent comprises C16-C36 branched and linear alkanes. In a still further aspect, the hydrocarbon solvent comprises C20-C36 branched and linear alkanes. In yet a further aspect, the hydrocarbon solvent comprises C24-C36 branched and linear alkanes. In an even further aspect, the hydrocarbon solvent comprises C4-C32 branched and linear alkanes. In a still further aspect, the hydrocarbon solvent comprises C4-C28 branched and linear alkanes. In yet a further aspect, the hydrocarbon solvent comprises C4-C24 branched and linear alkanes. In an even further aspect, the hydrocarbon solvent comprises C4-C20 branched and linear alkanes. In a still further aspect, the hydrocarbon solvent comprises C4-C16 branched and linear alkanes. In yet a further aspect, the hydrocarbon solvent comprises C4-C12 branched and linear alkanes.

In a further aspect, the hydrocarbon solvent comprises branched and linear alkanes. In a still further aspect, the hydrocarbon solvent comprises branched alkanes. In yet a further aspect, the hydrocarbon solvent comprises linear alkanes.

In a further aspect, the hydrocarbon solvent comprises C8-C26 branched and linear alkanes. In a still further aspect, the hydrocarbon solvent comprises C8-C26 branched alkanes. In yet a further aspect, the hydrocarbon solvent comprises C8-C26 linear alkanes.

In a further aspect, the hydrocarbon solvent has an average boiling point range of from about 180° C. to about 230° C. In a still further aspect, the hydrocarbon solvent has an average boiling point range of from about 190° C. to about 230° C. In yet a further aspect, the hydrocarbon solvent has an average boiling point range of from about 191° C. to about 230° C. In an even further aspect, the hydrocarbon solvent has an average boiling point range of from about 195° C. to about 230° C. In a still further aspect, the hydrocarbon solvent has an average boiling point range of from about 200° C. to about 230° C. In yet a further aspect, the hydrocarbon solvent has an average boiling point range of from about 205° C. to about 230° C. In an even further aspect, the hydrocarbon solvent has an average boiling point range of from about 210° C. to about 230° C. In a still further aspect, the hydrocarbon solvent has an average boiling point range of from about 180° C. to about 225° C. In yet a further aspect, the hydrocarbon solvent has an average boiling point range of from about 180° C. to about 220° C. In an even further aspect, the hydrocarbon solvent has an average boiling point range of from about 180° C. to about 215° C. In a still further aspect, the hydrocarbon solvent has an average boiling point range of from about 180° C. to about 210° C. In yet a further aspect, the hydrocarbon solvent has an average boiling point range of from about 180° C. to about 205° C. In an even further aspect, the hydrocarbon solvent has an average boiling point range of from about 180° C. to about 200° C. In a still further aspect, the hydrocarbon solvent has an average boiling point range of from about 185° C. to about 225° C. In yet a further aspect, the hydrocarbon solvent has an average boiling point range of from about 190° C. to about 220° C. In an even further aspect, the hydrocarbon solvent has an average boiling point range of from about 191° C. to about 220° C. In a still further aspect, the hydrocarbon solvent has an average boiling point range of from about 195° C. to about 215° C. In yet a further aspect, the hydrocarbon solvent has an average boiling point range of from about 200° C. to about 210° C. In an even further aspect, the hydrocarbon solvent has an average boiling point range of from about 190° C. to about 215° C. In a still further aspect, the hydrocarbon solvent has an average boiling point range of from about 191° C. to about 215° C. In yet a further aspect, the hydrocarbon solvent has an average boiling point range of from about 195° C. to about 215° C.

In a further aspect, the hydrocarbon solvent has an average boiling point of from about 200° C. to about 211° C. In a still further aspect, the hydrocarbon solvent has an average boiling point of from about 201° C. to about 211° C. In yet a further aspect, the hydrocarbon solvent has an average boiling point of from about 202° C. to about 211° C. In an even further aspect, the hydrocarbon solvent has an average boiling point of from about 203° C. to about 211° C. In a still further aspect, the hydrocarbon solvent has an average boiling point of from about 204° C. to about 211° C. In yet a further aspect, the hydrocarbon solvent has an average boiling point of from about 205° C. to about 211° C. In an even further aspect, the hydrocarbon solvent has an average boiling point of from about 200° C. to about 210° C. In a still further aspect, the hydrocarbon solvent has an average boiling point of from about 200° C. to about 209° C. In yet a further aspect, the hydrocarbon solvent has an average boiling point of from about 200° C. to about 208° C. In an even further aspect, the hydrocarbon solvent has an average boiling point of from about 200° C. to about 207° C. In a still further aspect, the hydrocarbon solvent has an average boiling point of from about 200° C. to about 206° C. In yet a further aspect, the hydrocarbon solvent has an average boiling point of from about 201° C. to about 210° C. In an even further aspect, the hydrocarbon solvent has an average boiling point of from about 202° C. to about 209° C.

In a further aspect, the hydrocarbon solvent has an average boiling point of about 200° C. In a still further aspect, the hydrocarbon solvent has an average boiling point of about 201° C. In yet a further aspect, the hydrocarbon solvent has an average boiling point of about 202° C. In an even further aspect, the hydrocarbon solvent has an average boiling point of about 203° C. In a still further aspect, the hydrocarbon solvent has an average boiling point of about 204° C.

In a further aspect, the hydrocarbon solvent has an average boiling point within less than ±3% of the boiling point of the alcohol at 1 atm. In a still further aspect, the hydrocarbon solvent has an average boiling point within less than ±2.5% of the boiling point of the alcohol at 1 atm. In yet a further aspect, the hydrocarbon solvent has an average boiling point within less than ±2% of the boiling point of the alcohol at 1 atm. In an even further aspect, the hydrocarbon solvent has an average boiling point within less than ±1.5% of the boiling point of the alcohol at 1 atm. In a still further aspect, the hydrocarbon solvent has an average boiling point within less than ±1.0% of the boiling point of the alcohol at 1 atm. In yet a further aspect, the hydrocarbon solvent has an average boiling point within less than 0.5% of the boiling point of the alcohol at 1 atm.

In a further aspect, the hydrocarbon solvent is present in an amount of from about 10 wt % to about 60 wt %. In a still further aspect, the hydrocarbon solvent is present in an amount of from about 15 wt % to about 60 wt %. In yet a further aspect, the hydrocarbon solvent is present in an amount of from about 20 wt % to about 60 wt %. In an even further aspect, the hydrocarbon solvent is present in an amount of from about 30 wt % to about 60 wt %. In a still further aspect, the hydrocarbon solvent is present in an amount of from about 40 wt % to about 60 wt %. In yet a further aspect, the hydrocarbon solvent is present in an amount of from about 10 wt % to about 50 wt %. In an even further aspect, the hydrocarbon solvent is present in an amount of from about 10 wt % to about 40 wt %. In a still further aspect, the hydrocarbon solvent is present in an amount of from about 10 wt % to about 30 wt %. In yet a further aspect, the hydrocarbon solvent is present in an amount of from about 20 wt % to about 60 wt %. In an even further aspect, the hydrocarbon solvent is present in an amount of from about 30 wt % to about 55 wt %. In a still further aspect, the hydrocarbon solvent is present in an amount of from about 40 wt % to about 50 wt %. In yet a further aspect, the hydrocarbon solvent is present in an amount of from about 45 wt % to about 50 wt %.

In a further aspect, the hydrocarbon solvent is present in an amount of about 20 wt %. In a still further aspect, the hydrocarbon solvent is present in an amount of from about 48 wt % to about 49 wt %. In yet a further aspect, the hydrocarbon solvent is present in an amount of about 50 wt %.

In a further aspect, the hydrocarbon solvent is produced by gas to liquid (GTL) technology.

In a further aspect, the hydrocarbon solvent is not high-flash mineral spirits. For example, in various aspects, the hydrocarbon solvent is not 142 Flash. Thus, in a further aspect, the hydrocarbon solvent does not contain about 77 wt % C9-C15 cycloalkanes and about 23 wt % C9-C15 alkanes. In a still further aspect, the hydrocarbon solvent does not have a boiling point range of from about 192° C. to about 205° C. In an alternative example, the hydrocarbon solvent is not D60. Thus, in a further aspect, the hydrocarbon solvent does not contain solvent naphtha(petroleum), medium aliphatics. In a still further aspect, the hydrocarbon solvent does not have a boiling point range of from about 179° C. to about 213.9° C.

In a further aspect, the hydrocarbon solvent is not mineral spirits. Thus, in various aspects, the hydrocarbon solvent does not consist essentially of light hydrotreated distillate (petroleum), heavy hydrotreated naphtha (petroleum), and/or petroleum hydrocarbon distillates. In a further aspect, the hydrocarbon solvent does not have a boiling point range of from about 159° C. to about 199° C.

2. Diisopropylbenzene or 2-Ethylhexyl Acetate

In one aspect, the disclosed compositions comprise diisopropylbenzene or 2-ethylhexyl acetate.

In a further aspect, the disclosed compositions comprise 2-ethylhexyl acetate.

In a further aspect, the disclosed compositions comprise diisopropylbenzene. Diisopropylbenzene is a chemical that is produced as an unwanted byproduct of the cumene manufacturing process, wherein benzene is reacted with propylene to form diisopropylbenzene. Because it is a waste product that is derived from fossil fuels, any new and novel use for diisopropylbenzene may improve the yield of value-added products from the dwindling supply of natural resources.

Diisopropylbenzene is less toxic than other developer solvents, including even natural terpene hydrocarbon solvents (which are often referred to as so-called "safe" solvents). Lastly, solvents containing diisopropylbenzene have a very mild and acceptable odor, making them significantly more pleasant to use than solvents containing lower molecular weight aromatic solvents, terpene derivatives, esters, ketones, or low molecular weight alcohols. This is a significant advantage, as the odor of a strong-smelling developer solvent will often permeate an entire plate-processing facility, making the indoor environment uncomfortable.

In a further aspect, diisopropylbenzene or 2-ethylhexyl acetate is present in an amount of from about 10 wt % to about 90 wt %. In a still further aspect, diisopropylbenzene or 2-ethylhexyl acetate is present in an amount of from about 10 wt % to about 80 wt %. In yet a further aspect, diisopropylbenzene or 2-ethylhexyl acetate is present in an amount of from about 10 wt % to about 70 wt %. In an even further aspect, diisopropylbenzene or 2-ethylhexyl acetate is present in an amount of from about 10 wt % to about 60 wt %. In yet a further aspect, diisopropylbenzene or 2-ethylhexyl acetate is present in an amount of from about 10 wt % to about 50 wt %. In an even further aspect, diisopropylbenzene or 2-ethylhexyl acetate is present in an amount of from about 10 wt % to about 40 wt %. In a still further aspect, diisopropylbenzene or 2-ethylhexyl acetate is present in an amount of from about 10 wt % to about 30 wt %. In yet a further aspect, diisopropylbenzene or 2-ethylhexyl acetate is present in an amount of from about 10 wt % to about 20 wt %. In an even further aspect, diisopropylbenzene or 2-ethylhexyl acetate is present in an amount of from about 20 wt % to about 90 wt %. In a still further aspect, diisopropylbenzene or 2-ethylhexyl acetate is present in an amount of from about 30 wt % to about 90 wt %. In yet a further aspect, diisopropylbenzene or 2-ethylhexyl acetate is present in an amount of from about 40 wt % to about 90 wt %. In an even further aspect, diisopropylbenzene or 2-ethylhexyl acetate is present in an amount of from about 50 wt % to about 90 wt %. In a still further aspect, diisopropylbenzene or 2-ethylhexyl acetate is present in an amount of from about 60 wt % to about 90 wt %. In yet a further aspect, diisopropylbenzene or 2-ethylhexyl acetate is present in an amount of from about 70 wt % to about 90 wt %. In an even further aspect, diisopropylbenzene or 2-ethylhexyl acetate is present in an amount of from about 80 wt % to about 90 wt %. In a still further aspect, diisopropylbenzene or 2-ethylhexyl acetate is present in an amount of from about 20 wt % to about 80 wt %. In yet a further aspect, diisopropylbenzene or 2-ethylhexyl acetate is present in an amount of from about 20 wt % to about 30 wt %.

In a further aspect, diisopropylbenzene or 2-ethylhexyl acetate is present in an amount of about 25 wt %. In a still further aspect, diisopropylbenzene or 2-ethylhexyl acetate is present in an amount of 28 wt %. In yet a further aspect, diisopropylbenzene or 2-ethylhexyl acetate is present in an amount of 80 wt %.

3. Co-Solvents

In one aspect, the disclosed compositions comprise a co-solvent selected from tetrahydrofurfuryl alcohol, 2-ethoxyethanol, terpineol, dipropylene glycol methyl ether, 2-butoxyethanol, 2-(2-butyoxyethoxy) ethanol, a naphthenic hydrocarbon, a paraffinic hydrocarbon, an olefinic hydrocarbon, an isoparaffinic hydrocarbon, a terepene, benzyl alcohol, cyclohexanol, methyl cyclohexanol, hexyl alcohol, and heptyl alcohol. In a still further aspect, the co-solvent is selected from cyclohexanol and benzyl alcohol. In yet a further aspect, the co-solvent is cyclohexanol. In an even further aspect, the co-solvent is benzyl alcohol.

In one aspect, the co-solvent is present and comprises an alcohol.

In one aspect, the disclosed composition further comprises benzyl alcohol.

In one aspect, the disclosed composition comprises an alcohol having a boiling point. In a further aspect, the boiling point is within less than ±2% of the average boiling point of the hydrocarbon solvent at 1 atm. In a still further aspect, the alcohol is benzyl alcohol. Additional examples of alcohols include, but are not limited to, tetrahydrofurfuryl alcohol, 2-ethoxyethanol, benzyl alcohol, terpineol, cyclohexanol, methyl cyclohexanol, hexyl alcohol, heptyl alcohol, dipropylene glycol methyl ether, 2-butoxyethanol, and 2-(2-butoxyethoxy) ethanol.

In one aspect, the composition comprises an alcohol having a 50% volume temperature within less than ±2% of the 50% volume temperature of the composition. In a further aspect, the alcohol has a 50% volume temperature within less than ±1.5% of the 50% volume temperature of the composition. In yet a further aspect, the alcohol has a 50% volume temperature within less than ±1% of the 50% volume temperature of the composition. In an even further aspect, the alcohol has a 50% volume temperature within less than ±0.5% of the 50% volume temperature of the composition.

In one aspect, the composition comprises an alcohol having a 50% volume temperature within less than ±2% of the 50% volume temperature of the composition and a boiling point within less than ±2% of the average boiling point of the hydrocarbon solvent at 1 atm. In a further aspect, the composition comprises an alcohol having a 50% volume temperature within less than ±1% of the 50% volume temperature of the composition and a boiling point within less than ±1% of the average boiling point of the hydrocarbon solvent at 1 atm.

Preferably, the co-solvent should be miscible with diisopropylbenzene or 2-ethylhexyl acetate, have suitable solubility parameters, have suitable toxicity and safety profiles, be readily disposable, and have pleasant odors. These co-solvents are used to modify the properties of the composition. This includes to aid in the removal of the cover layer on the flexographic plate (e.g., tetrahydrofurfuryl alcohol) and/or form an azeotrope (e.g., benzyl alcohol).

In a further aspect, the alcohol has a boiling point within less than ±2% of the average boiling point of the hydrocarbon solvent at 1 atm. In a still further aspect, the alcohol has a boiling point within less than ±1.5% of the average boiling point of the hydrocarbon solvent at 1 atm. In yet a further aspect, the alcohol has a boiling point within less than ±1% of the average boiling point of the hydrocarbon solvent at 1 atm. In an even further aspect, the alcohol has a boiling point within less than ±0.5% of the average boiling point of the hydrocarbon solvent at 1 atm.

In a further aspect, the co-solvent is present in an amount of less than about 35 wt %. In a still further aspect, the co-solvent is present in an amount of less than about 30 wt %. In yet a further aspect, the co-solvent is present in an amount of less than about 25 wt %. In an even further aspect, the co-solvent is present in an amount of less than about 20 wt %. In a still further aspect, the co-solvent is present in an amount of less than about 15 wt %. In yet a further aspect, the co-solvent is present in an amount of less than about 10 wt %. In an even further aspect, the co-solvent is present in an amount of less than about 5 wt %. In a still further aspect, the co-solvent is present in an amount of less than about 1 wt %. In yet a further aspect, the co-solvent is not present.

In a further aspect, the co-solvent is present in an amount of about 20 wt %. In a still further aspect, the co-solvent is present in an amount of about 25 wt %.

In a further aspect, the benzyl alcohol is present in an amount of less than about 35 wt %. In a still further aspect, the benzyl alcohol is present in an amount of less than about 30 wt %. In yet a further aspect, the benzyl alcohol is present in an amount of less than about 25 wt %. In an even further aspect, the benzyl alcohol is present in an amount of less than about 20 wt %. In a still further aspect, the benzyl alcohol is present in an amount of less than about 15 wt %.

In yet a further aspect, the benzyl alcohol is present in an amount of less than about 10 wt %. In an even further aspect, the benzyl alcohol is present in an amount of less than about 5 wt %. In a still further aspect, the benzyl alcohol is present in an amount of less than about 1 wt %. In yet a further aspect, the benzyl alcohol is not present.

In a further aspect, the benzyl alcohol is present in an amount of about 20 wt %. In a still further aspect, the benzyl alcohol is present in an amount of about 25 wt %.

4. Additional Components

In one aspect, the composition further comprises dihydromyrcenol.

In further aspect, the dihydromyrcenol is present in an amount of from about 0.1 wt % to about 5 wt %. In a still further aspect, the dihydromyrcenol is present in an amount of from about 0.5 wt % to about 5 wt %. In yet a further aspect, the dihydromyrcenol is present in an amount of from about 1 wt % to about 5 wt %. In an even further aspect, the dihydromyrcenol is present in an amount of from about 3 wt % to about 5 wt %. In a still further aspect, the dihydromyrcenol is present in an amount of from about 0.1 wt % to about 3 wt %. In yet a further aspect, the dihydromyrcenol is present in an amount of from about 0.1 wt % to about 1 wt %. In an even further aspect, the dihydromyrcenol is present in an amount of from about 0.1 wt % to about 0.5 wt %. In a still further aspect, the dihydromyrcenol is present in an amount of about 3 wt %.

In one aspect, the composition further comprises a defoamer, for example, patcote. Patcote is a 10% active silicone emulsion antifoam suitable for use as a defoamer in food applications (including Kosher) in, for example, up to 10 ppm active silicone. In a further aspect, the defoamer (e.g., patcote) is present in an amount of less than about 5 wt %. In a still further aspect, the defoamer (e.g., patcote) is present in an amount of less than about 4 wt %. In yet a further aspect, the defoamer (e.g., patcote) is present in an amount of less than about 3 wt %. In an even further aspect, the defoamer (e.g., patcote) is present in an amount of less than about 2 wt %. In a still further aspect, the defoamer (e.g., patcote) is present in an amount of less than about 1 wt %. In yet a further aspect, the defoamer (e.g., patcote) is present in an amount of less than about 0.5 wt %. In an even further aspect, the defoamer (e.g., patcote) is present in an amount of less than about 0.1 wt %. In a still further aspect, the defoamer (e.g., patcote) is present in an amount of less than about 0.05 wt %. In yet a further aspect, the defoamer (e.g., patcote) is present in an amount of about 0.05 wt %.

In one aspect, the invention further comprises pine oil. In a further aspect, the pine oil comprises at least one alcohol in an amount of from about 60 wt % to about 90 wt %. In a still further aspect, the pine oil comprises at least one alcohol in an amount of from about 70 wt % to about 90 wt %. In yet a further aspect, the pine oil comprises at least one alcohol in an amount of from about 80 wt % to about 90 wt %. In an even further aspect, the pine oil comprises at least one alcohol in an amount of from about 60 wt % to about 80 wt %. In a still further aspect, the pine oil comprises at least one alcohol in an amount of from about 60 wt % to about 70 wt %.

In a further aspect, the pine oil is present in an amount of from about 0.1 wt % to about 5 wt %. In a still further aspect, the pine oil is present in an amount of from about 0.5 wt % to about 5 wt %. In yet a further aspect, the pine oil is present in an amount of from about 1 wt % to about 5 wt %. In an even further aspect, the pine oil is present in an amount of from about 3 wt % to about 5 wt %. In a still further aspect, the pine oil is present in an amount of from about 0.1 wt % to about 3 wt %. In yet a further aspect, the pine oil is present in an amount of from about 0.1 wt % to about 1 wt %. In an even further aspect, the pine oil is present in an amount of from about 0.1 wt % to about 0.5 wt %.

In various aspects, the composition may further comprise an additional component.

C. Methods for Making a Platewash Solution

In one aspect, disclosed are methods for making a disclosed composition.

Thus, in a further aspect, disclosed are methods for making a solvent solution, the method comprising: (a) providing 2-ethylhexyl acetate or diisopropylbenzene; and (b) combining with a hydrocarbon solvent having an average boiling point of from about 200° C. to about 211° C. at 1 atm, thereby making the solvent solution. In yet a further aspect, the method comprises providing diisopropylbenzene. In an even further aspect, the method comprises providing 2-ethylhexyl acetate.

In a further aspect, the method further comprises combining with a co-solvent selected from tetrahydrofurfuryl alcohol, 2-ethoxyethanol, terpineol, dipropylene glycol methyl ether, 2-butoxyethanol, 2-(2-butyoxyethoxy) ethanol, a naphthenic hydrocarbon, a paraffinic hydrocarbon, an olefinic hydrocarbon, an isoparaffinic hydrocarbon, a terepene, benzyl alcohol, cyclohexanol, methyl cyclohexanol, hexyl alcohol, and heptyl alcohol. In a still further aspect, the method further comprises combining with an alcohol. In a still further aspect, the alcohol is selected from tetrahydrofurfuryl alcohol, 2-ethoxyethanol, benzyl alcohol, terpineol, cyclohexanol, methyl cyclohexanol, hexyl alcohol, heptyl alcohol, dipropylene glycol methyl ether, 2-butoxyethanol, and 2-(2-butoxyethoxy) ethanol, or a mixture thereof. In yet a further aspect, the at least one alcohol is selected from tetrahydrofurfuryl alcohol, 2-ethoxyethanol, benzyl alcohol, terpineol, cyclohexanol, methyl cyclohexanol, heptyl alcohol, dipropylene glycol methyl ether, 2-butoxyethanol, and 2-(2-butoxyethoxy) ethanol, or a mixture thereof. In an even further aspect, the alcohol is benzyl alcohol.

In a further aspect, disclosed are methods for making a solvent solution, the method comprising: (a) providing a hydrocarbon solvent having an average boiling point; (b) combining with an alcohol having a boiling point within less than ±2% of the average boiling point of the hydrocarbon solvent at 1 atm; and (c) combining with 2-ethylhexyl acetate or diisopropylbenzene, thereby making the solvent solution. In a still further aspect, the alcohol is selected from tetrahydrofurfuryl alcohol, 2-ethoxyethanol, benzyl alcohol, terpineol, cyclohexanol, methyl cyclohexanol, heptyl alcohol, dipropylene glycol methyl ether, 2-butoxyethanol, and 2-(2-butoxyethoxy) ethanol, or a mixture thereof. In yet a further aspect, the alcohol is benzyl alcohol. In a still further aspect, the method comprises combining with diisopropylbenzene. In yet a further aspect, the method comprises combining with 2-ethylhexyl acetate.

In a further aspect, disclosed are methods for making a solvent solution, the method comprising: (a) providing an alcohol having a boiling point; (b) combining with 2-ethylhexyl acetate or diisopropylbenzene; and (c) combining with a hydrocarbon solvent having an average boiling point within less than ±3% of the boiling point of the alcohol at 1 atm. In a still further aspect, the alcohol is selected from tetrahydrofurfuryl alcohol, 2-ethoxyethanol, benzyl alcohol, terpineol, cyclohexanol, methyl cyclohexanol, heptyl alcohol, dipropylene glycol methyl ether, 2-butoxyethanol, and 2-(2-butoxyethoxy) ethanol, or a mixture thereof. In yet a further aspect, the alcohol is benzyl alcohol. In a still further aspect, the method comprises combining with diisopropylbenzene. In yet a further aspect, the method comprises combining with 2-ethylhexyl acetate.

In a further aspect, disclosed are methods for making a solvent solution, the method comprising: (a) providing benzyl alcohol; (b) combining 2-ethylhexyl acetate or diisopropylbenzene; and (c) combining with a hydrocarbon solvent, wherein the hydrocarbon solvent has a boiling point range of from about 190° C. to about 215° C. In a still further aspect, the co-solvent is 2-ethylhexyl acetate. In yet a further aspect, the co-solvent is diisopropylbenzene.

In a further aspect, disclosed are methods for making a solvent solution having a 50% volume temperature, the method comprising: (a) providing a hydrocarbon solvent having a 50% volume temperature within less than ±2% of the 50% volume temperature of the solvent solution; (b) combining with diisopropylbenzene or 2-ethylhexyl acetate; and (c) optionally, combining with a co-solvent selected from tetrahydrofurfuryl alcohol, 2-ethoxyethanol, terpineol, dipropylene glycol methyl ether, 2-butoxyethanol, 2-(2-butyoxyethoxy) ethanol, a naphthenic hydrocarbon, a paraffinic hydrocarbon, an olefinic hydrocarbon, an isoparaffinic hydrocarbon, a terepene, benzyl alcohol, cyclohexanol, methyl cyclohexanol, hexyl alcohol, and heptyl alcohol.

In a further aspect, disclosed are methods for making a solvent solution having a 50% volume temperature, the method comprising: (a) providing a hydrocarbon solvent; (b) combining with diisopropylbenzene or 2-ethylhexyl acetate; and (c) combining with an alcohol having a 50% volume temperature within less than ±2% of the 50% volume temperature of the solvent solution.

In a further aspect, disclosed are methods for making a solvent solution having a 50% volume temperature, the method comprising: (a) providing a hydrocarbon solvent having a 50% volume temperature within less than ±2% of the 50% volume temperature of the solvent solution and an average boiling point within less than ±3% of the boiling point of the alcohol at 1 atm; (b) combining with diisopropylbenzene or 2-ethylhexyl acetate; and (c) combining with an alcohol having a 50% volume temperature within less than ±2% of the 50% volume temperature of the solvent solution and a boiling point within less than ±2% of the average boiling point of the hydrocarbon solvent at 1 atm.

In a further aspect, the method further comprises combining with dihydromyrcenol.

In a further aspect, the method further comprises combining with a defoamer (e.g., patcote).

D. Purification Methods

In one aspect, disclosed are purification methods comprising the steps of: (a) vaporizing a composition comprising: (i) 2-ethylhexyl acetate or diisopropylbenzene; and (ii) a hydrocarbon solvent having an average boiling point of from about 200° C. to about 211° C. at 1 atm, thereby making a vapor; and (b) condensing the vapor.

In one aspect, disclosed are purification methods comprising the steps of: (a) vaporizing a composition comprising: (i) a hydrocarbon solvent having an average boiling point; (ii) an alcohol having a boiling point within less than ±2% of the average boiling point of the hydrocarbon solvent at 1 atm; and (iii) 2-ethylhexyl acetate or diisopropylbenzene, thereby making a vapor; and (b) condensing the vapor.

In one aspect, disclosed are purification methods comprising the steps of: (a) vaporizing a composition comprising: (i) an alcohol having a boiling point; (ii) 2-ethylhexyl acetate or diisopropylbenzene; and (iii) a hydrocarbon solvent having an average boiling point within less than ±3% of the boiling point of the alcohol at 1 atm, thereby making a vapor; and (b) condensing the vapor.

In one aspect, disclosed are purification methods comprising the steps of: (a) vaporizing a composition comprising benzyl alcohol, 2-ethylhexyl acetate or diisopropylbenzene, and a hydrocarbon solvent, wherein the hydrocarbon solvent has a boiling point range of from about 190° C. to about 215° C., thereby making a vapor; and (b) condensing the vapor.

In a further aspect, disclosed are purification methods comprising the steps of: (a) vaporizing a solvent solution having a 50% volume temperature, wherein the solvent solution comprises: (i) a hydrocarbon solvent having a 50% volume temperature within less than ±2% of the 50% volume temperature of the solvent solution; (ii) diisopropylbenzene or 2-ethylhexyl acetate; and (iii) optionally, a co-solvent selected from tetrahydrofurfuryl alcohol, 2-ethoxyethanol, terpineol, dipropylene glycol methyl ether, 2-butoxyethanol, 2-(2-butyoxyethoxy) ethanol, a naphthenic hydrocarbon, a paraffinic hydrocarbon, an olefinic hydrocarbon, an isoparaffinic hydrocarbon, a terepene, benzyl alcohol, cyclohexanol, methyl cyclohexanol, hexyl alcohol, and heptyl alcohol; and (b) condensing the vapor.

In a further aspect, disclosed are purification methods comprising the steps of: (a) vaporizing a solvent solution having a 50% volume temperature, wherein the solvent solution comprises: (i) a hydrocarbon solvent; (ii) diisopropylbenzene or 2-ethylhexyl acetate; and (iii) an alcohol having a 50% volume temperature within less than ±2% of the 50% volume temperature of the solvent solution; and (b) condensing the vapor.

In a further aspect, disclosed are purification methods comprising the steps of: (a) vaporizing a solvent solution having a 50% volume temperature, wherein the solvent solution comprises: (i) a hydrocarbon solvent having a 50% volume temperature within less than ±2% of the 50% volume temperature of the solvent solution and an average boiling point within less than ±3% of the boiling point of the alcohol at 1 atm; (ii) diisopropylbenzene or 2-ethylhexyl acetate; and (iii) an alcohol having a 50% volume temperature within less than ±2% of the 50% volume temperature of the solvent solution and a boiling point within less than ±2% of the average boiling point of the hydrocarbon solvent at 1 atm; and (b) condensing the vapor.

In a further aspect, the solvent solution further comprises an alcohol. In a still further aspect, the alcohol is selected from tetrahydrofurfuryl alcohol, 2-ethoxyethanol, benzyl alcohol, terpineol, cyclohexanol, methyl cyclohexanol, hexyl alcohol, heptyl alcohol, dipropylene glycol methyl ether, 2-butoxyethanol, and 2-(2-butoxyethoxy) ethanol, or a mixture thereof. In yet a further aspect, the at least one alcohol is selected from tetrahydrofurfuryl alcohol, 2-ethoxyethanol, benzyl alcohol, terpineol, cyclohexanol, methyl cyclohexanol, heptyl alcohol, dipropylene glycol methyl ether, 2-butoxyethanol, and 2-(2-butoxyethoxy) ethanol, or a mixture thereof. In an even further aspect, the alcohol is benzyl alcohol.

In a further aspect, vaporizing is via a heat source. In a still further aspect, the heat source has a temperature of from about 180° C. to about 230° C. In yet a further aspect, the heat source has a temperature of from about 190° C. to about 230° C. In an even further aspect, the heat source has a temperature of from about 200° C. to about 230° C. In a still further aspect, the heat source has a temperature of from about 210° C. to about 230° C. In yet a further aspect, the heat source has a temperature of from about 180° C. to about 220° C. In an even further aspect, the heat source has a temperature of from about 180° C. to about 210° C. In a still further aspect, the heat source has a temperature of from about 180° C. to about 200° C. In yet a further aspect, the heat source has a temperature of from about 190° C. to about 220° C. In an even further aspect, the heat source has a temperature of from about 190° C. to about 215° C.

In a further aspect, the condensed vapor is substantially uniform.

In a further aspect, substantially the same proportions as the undistilled composition is within ±5%. In a still further aspect, substantially the same proportions as the undistilled composition is within ±4%. In yet a further aspect, substantially the same proportions as the undistilled composition is within ±3%. In an even further aspect, substantially the same proportions as the undistilled composition is within ±2%. In a still further aspect, substantially the same proportions as the undistilled composition is within ±1%.

E. Examples

The following examples are put forth so as to provide those of ordinary skill in the art with a complete disclosure and description of how the compositions and/or methods claimed herein are made and evaluated, and are intended to be purely exemplary of the invention and are not intended to limit the scope of what the inventors regard as their invention. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

1. Preparation of Platewash Solutions

Formulations for platewash compositions are shown in Table 1 below.

TABLE 1

| No. | Component | wt % | Hydrocarbon Solvent | wt % | Benzyl Alcohol (wt %) |
|---|---|---|---|---|---|
| 1 | DIPB | 28 | D60 | 52 | 20 |
| 2 | DIPB | 28 | GS190 | 52 | 20 |
| 3 | DIPB | 28 | Isopar L | 52 | 20 |
| 4 | 2-ethylhexyl acetate | 25 | D60 | 50 | 25 |
| 5 | 2-ethylhexyl acetate | 25 | GS190 | 50 | 25 |
| 6 | 2-ethylhexyl acetate | 25 | Isopar L | 50 | 25 |
| 7 | DIPB | 80 | D60 | 20 | — |
| 8 | DIPB | 80 | GS190 | 20 | — |
| 9 | DIPB | 80 | Isopar L | 20 | — |

2. Properties of Individual Components

Figure 2A:
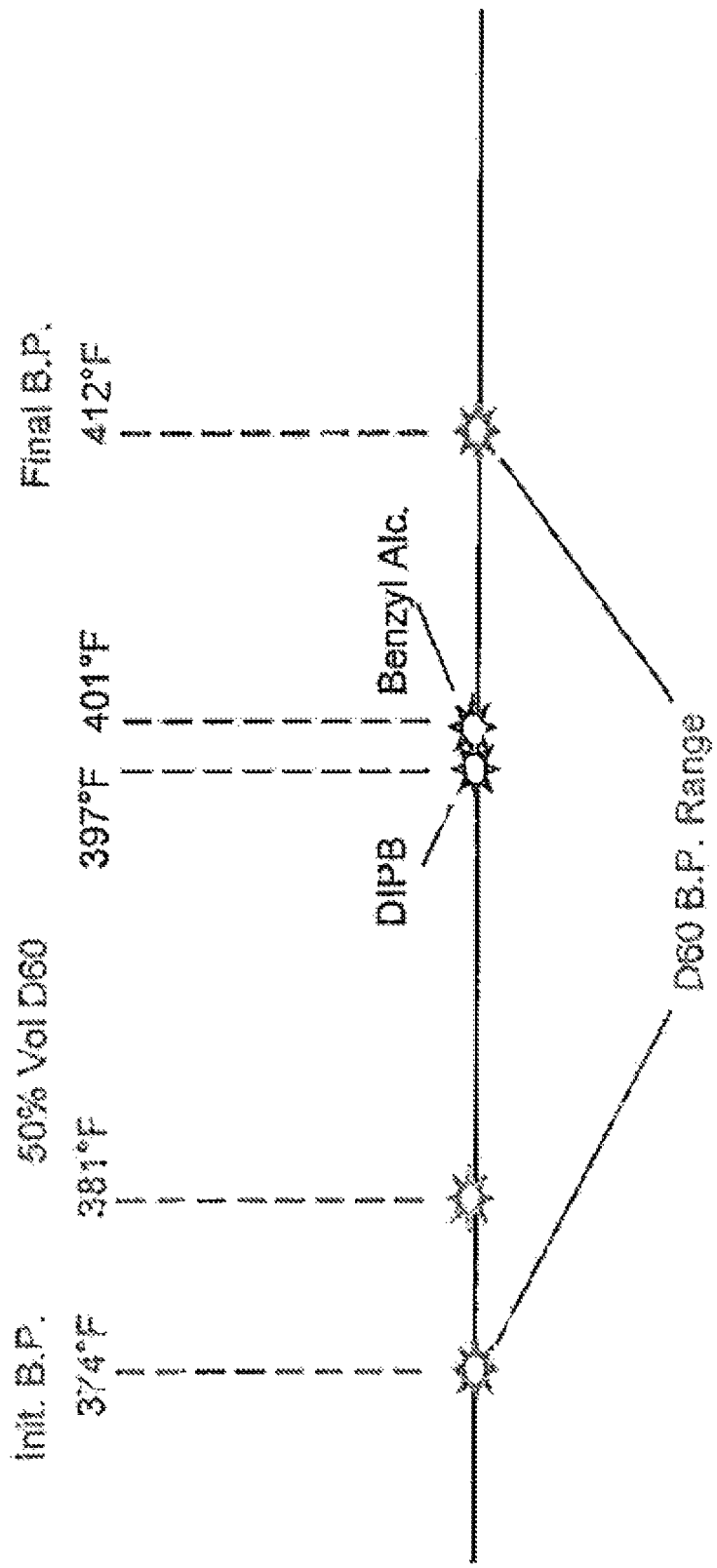
FIG. 2A-I show representative images illustrating a boiling point analysis including the 50% volume temperature of the hydrocarbon solvent based on the individual components of formulations nos. 1-9, respectively.
Figure 2B:
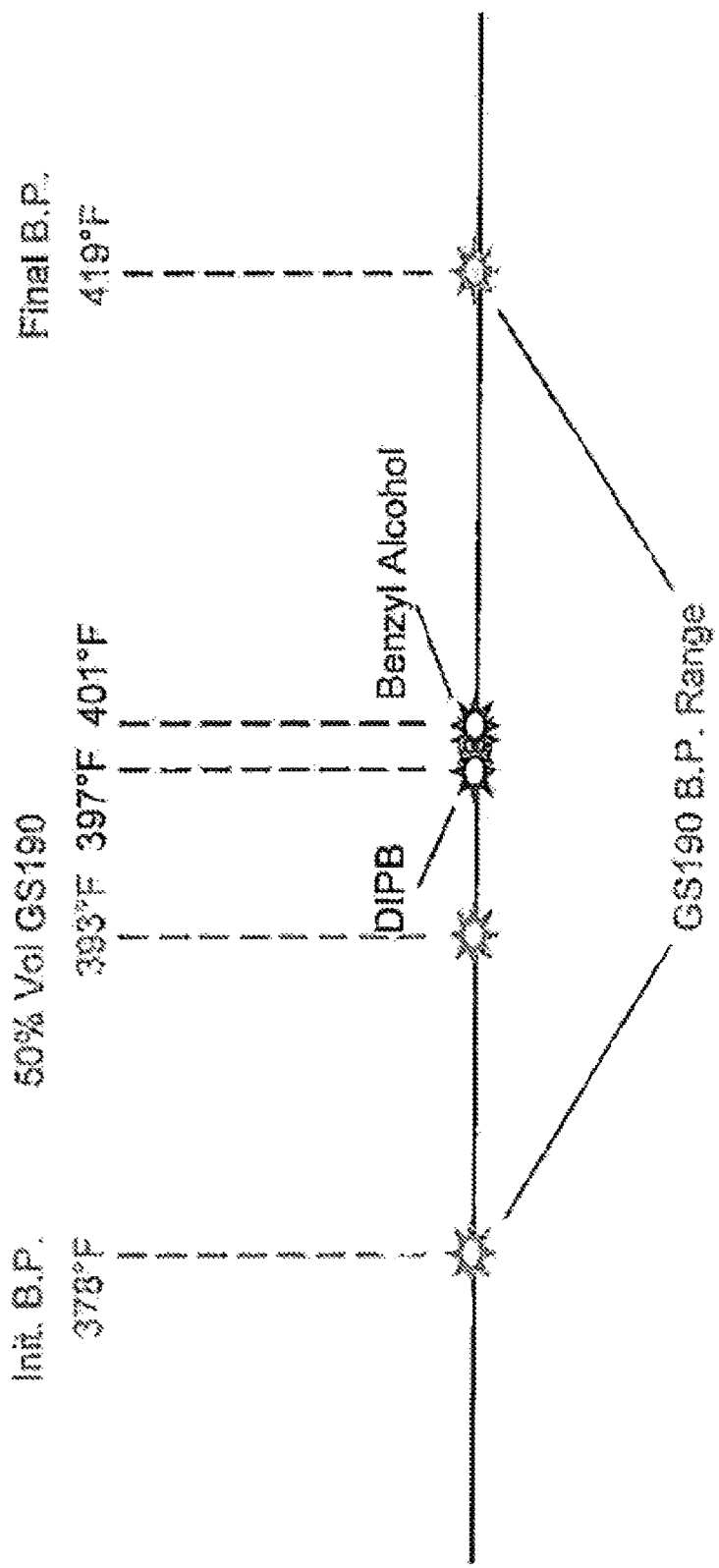
Figure 2C:
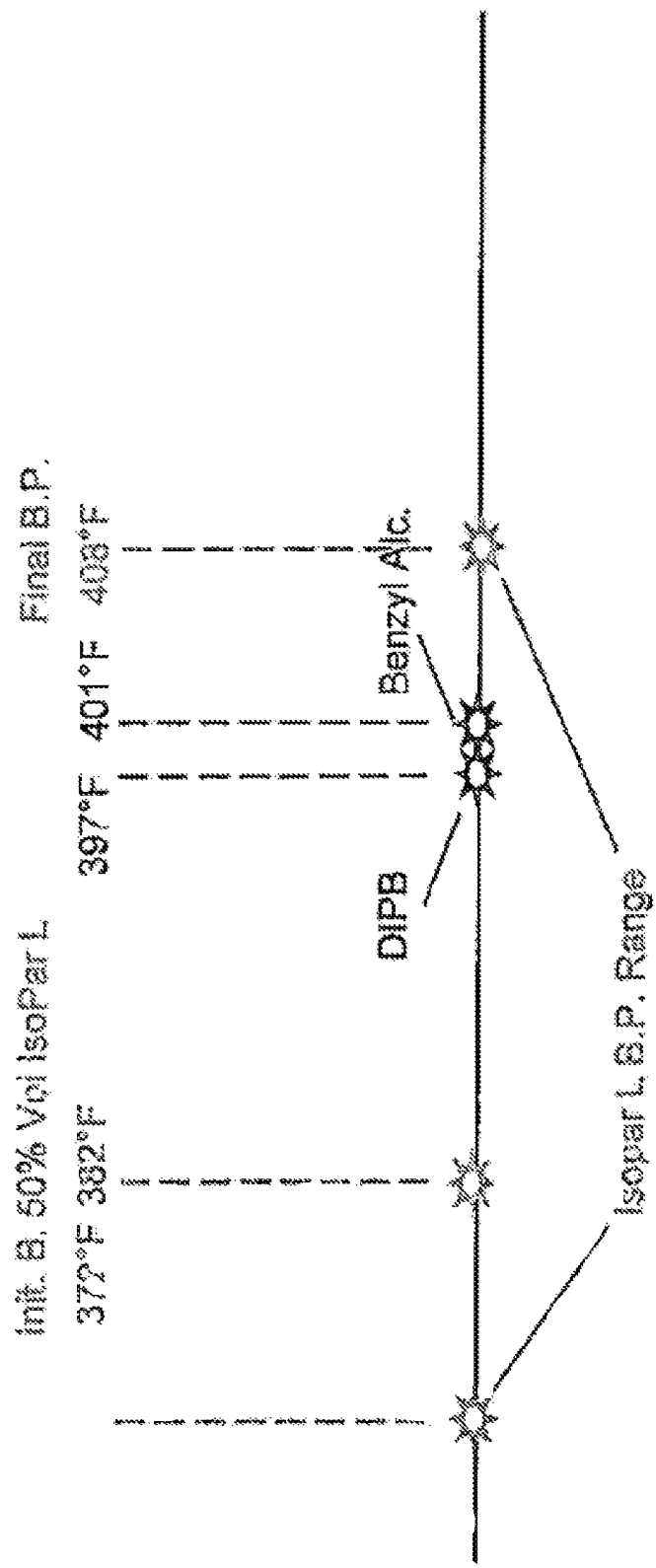
Figure 2D:
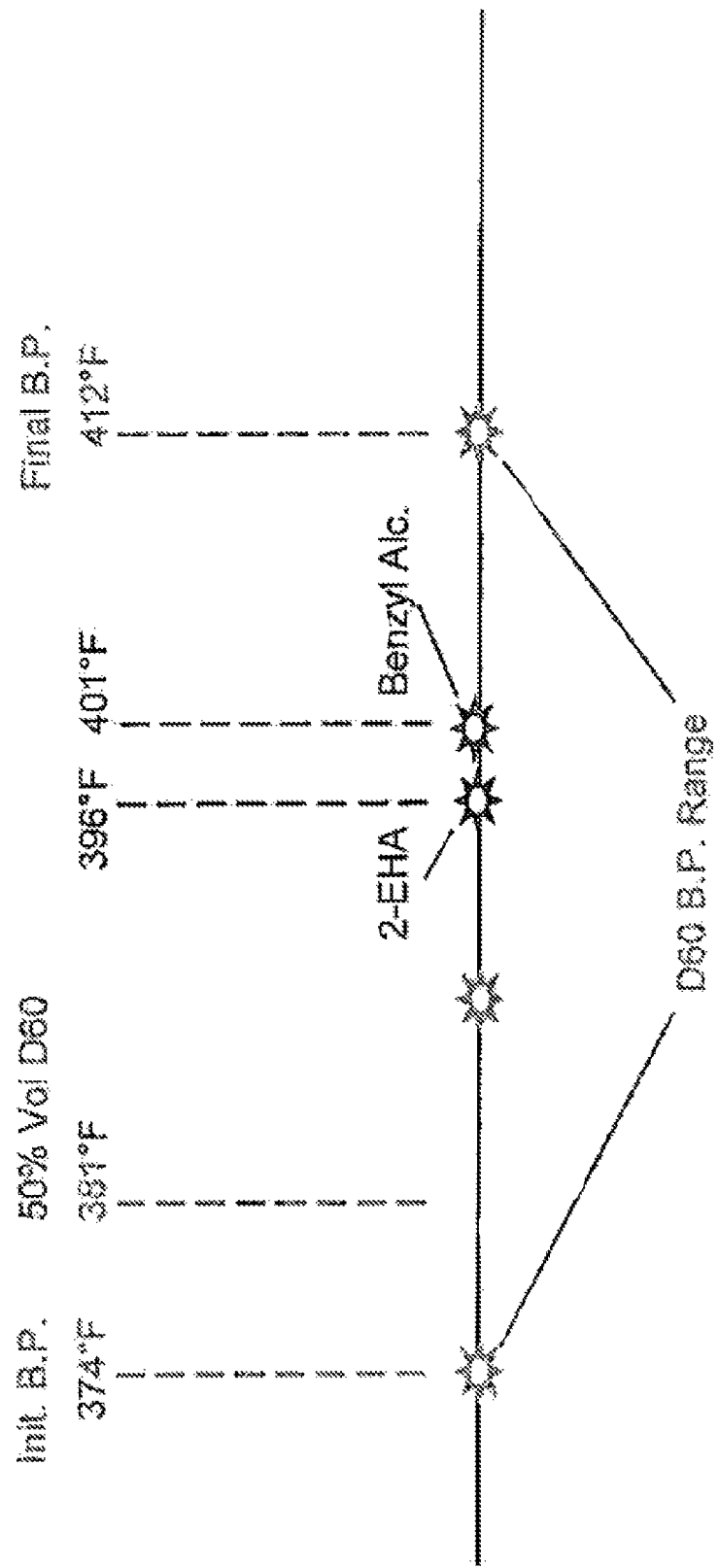
Figure 2E:
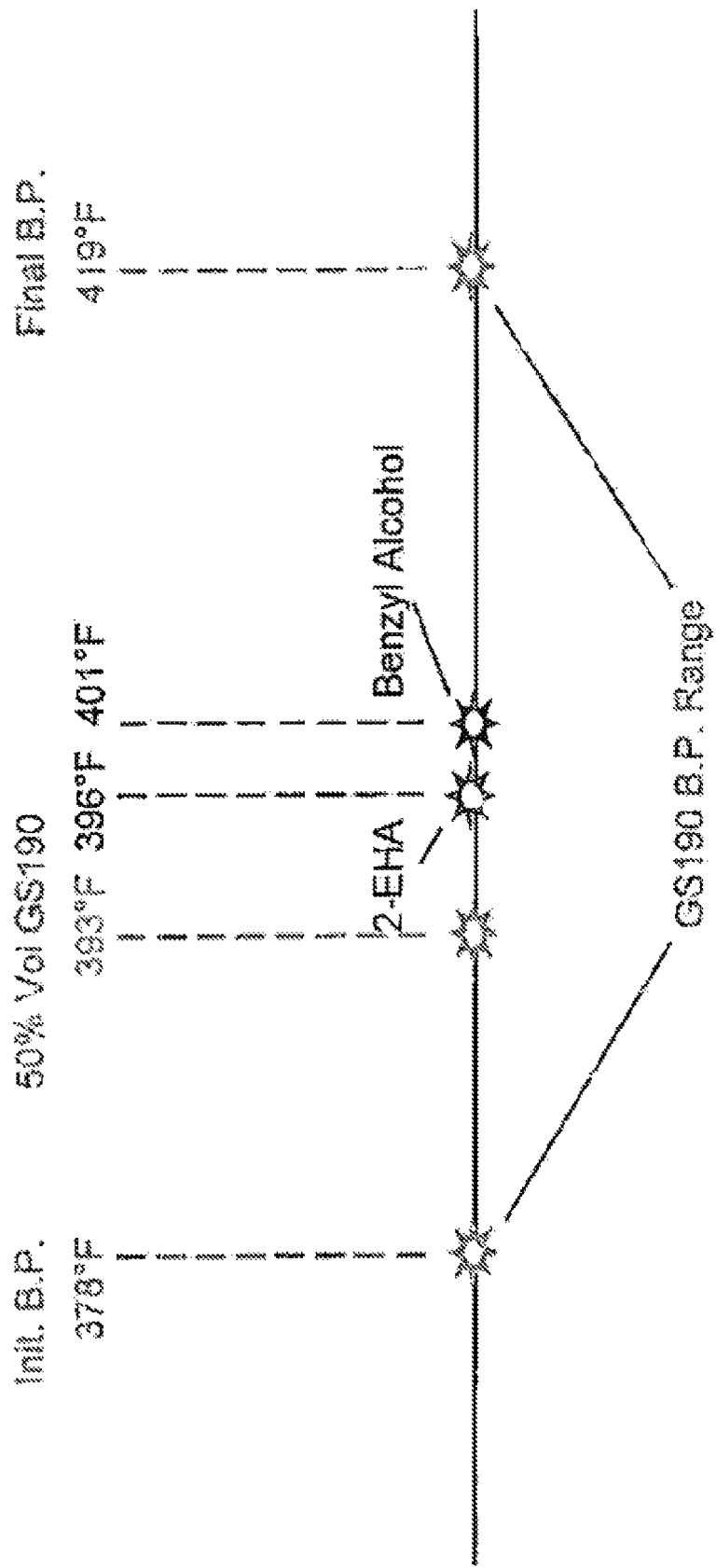
Figure 2F:
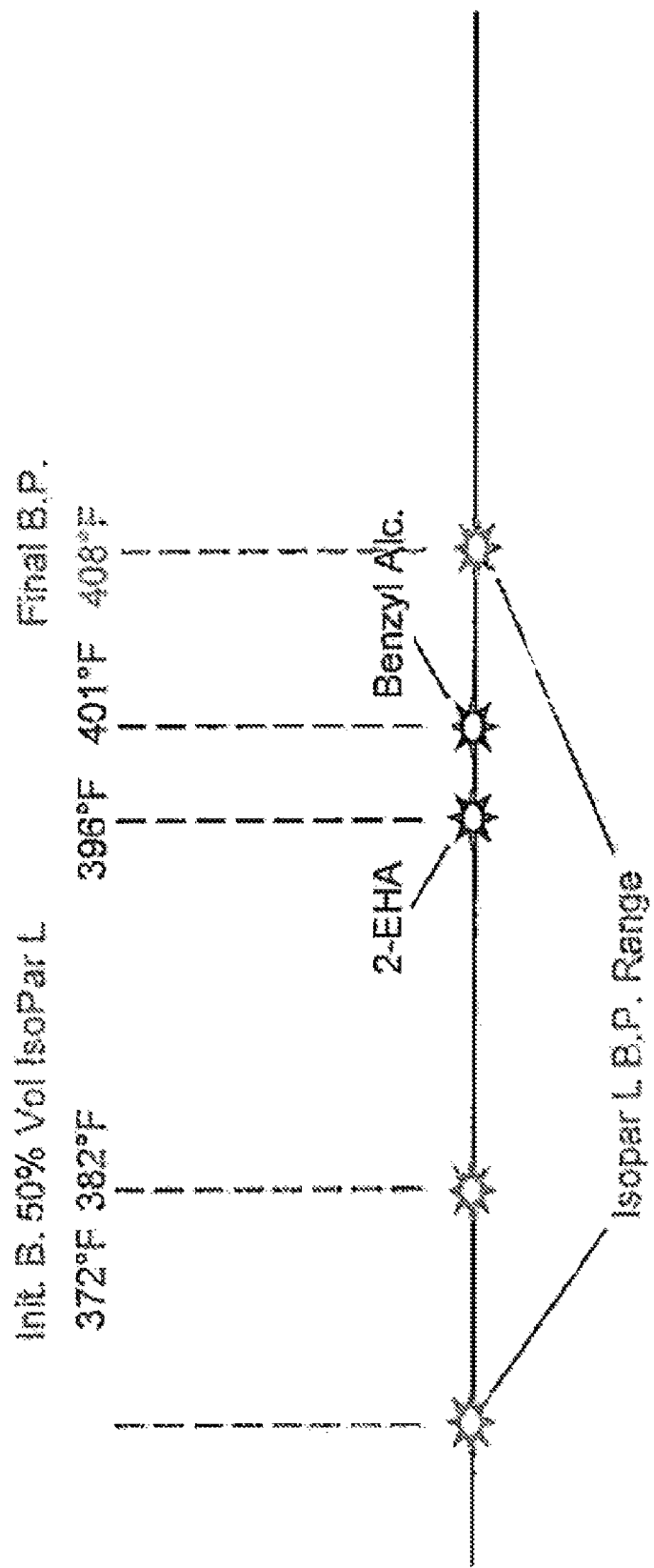
Figure 2G:
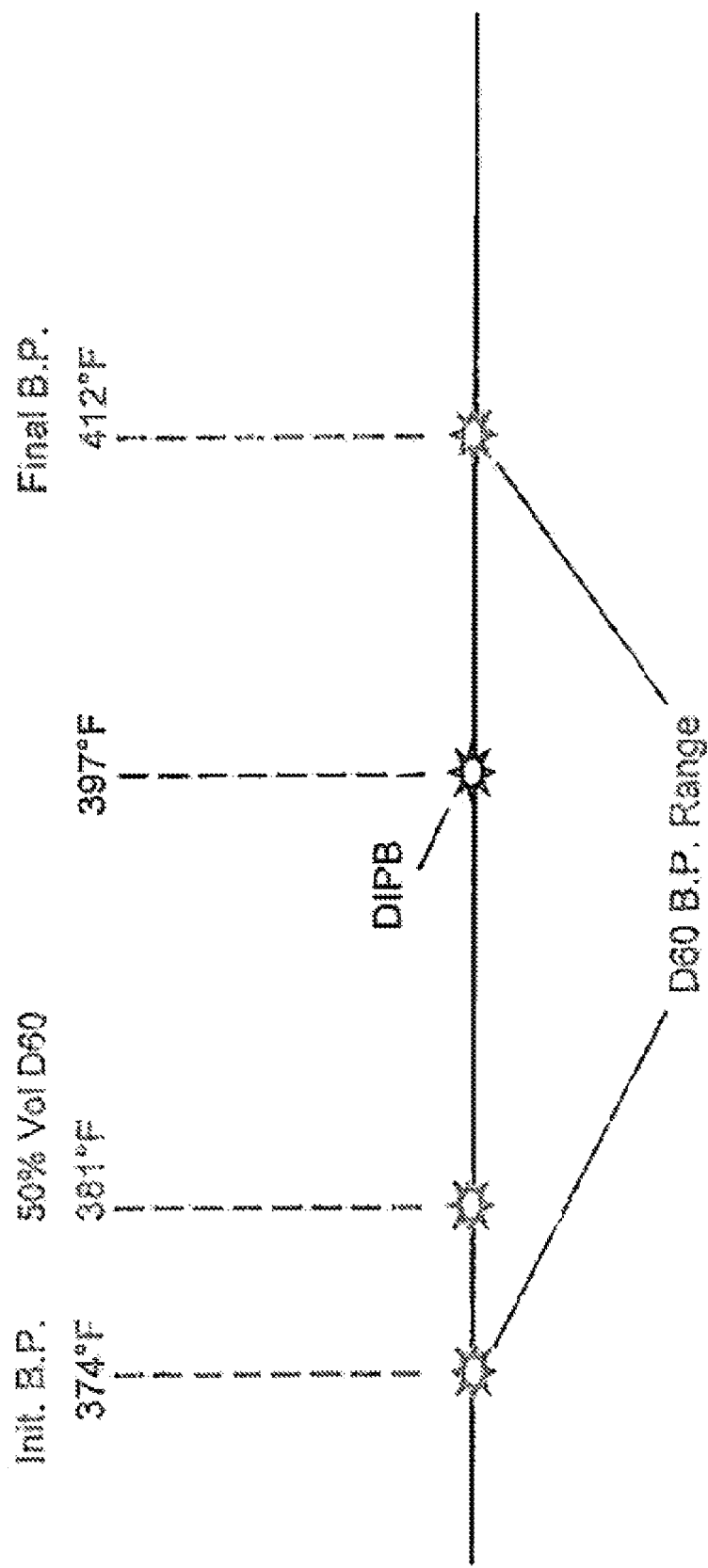
Figure 2H:
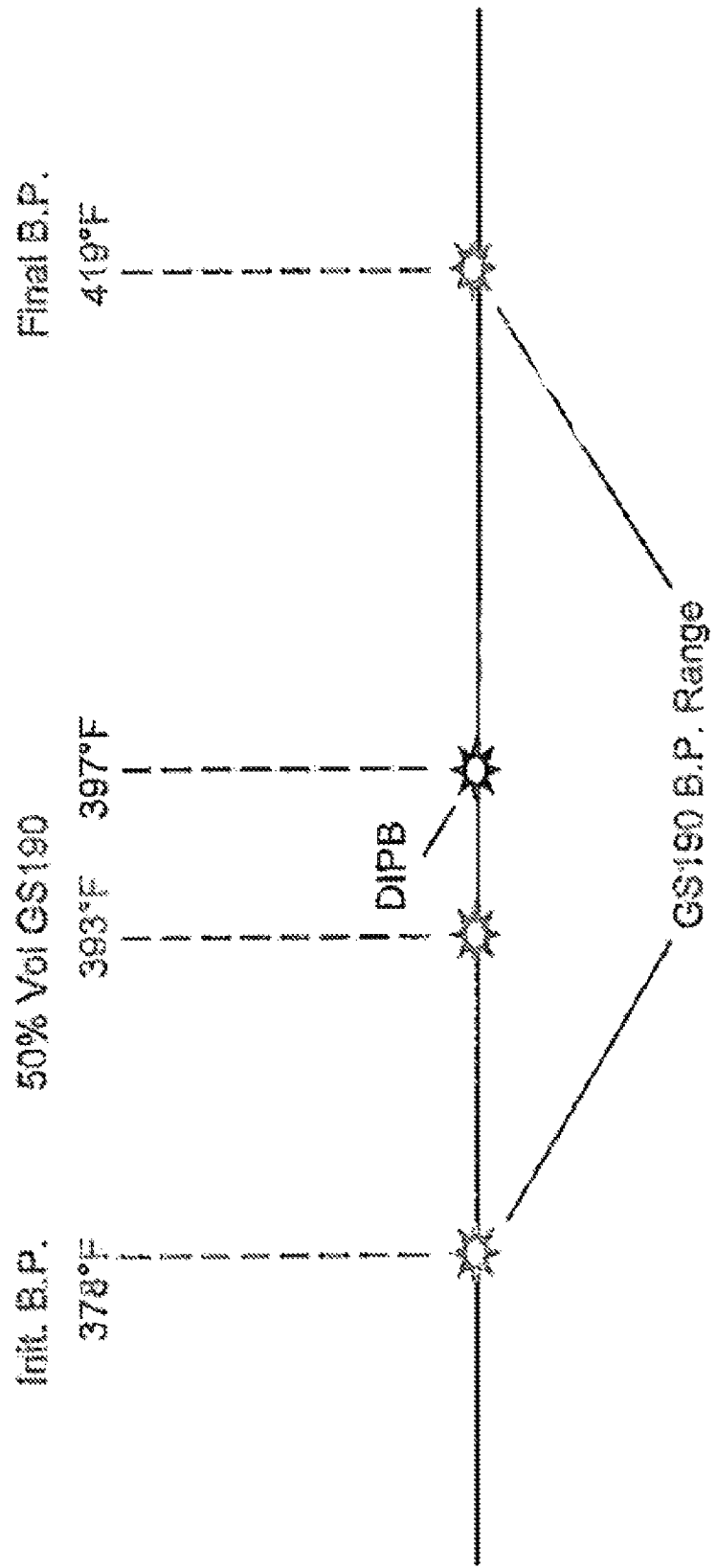
Figure 2I:
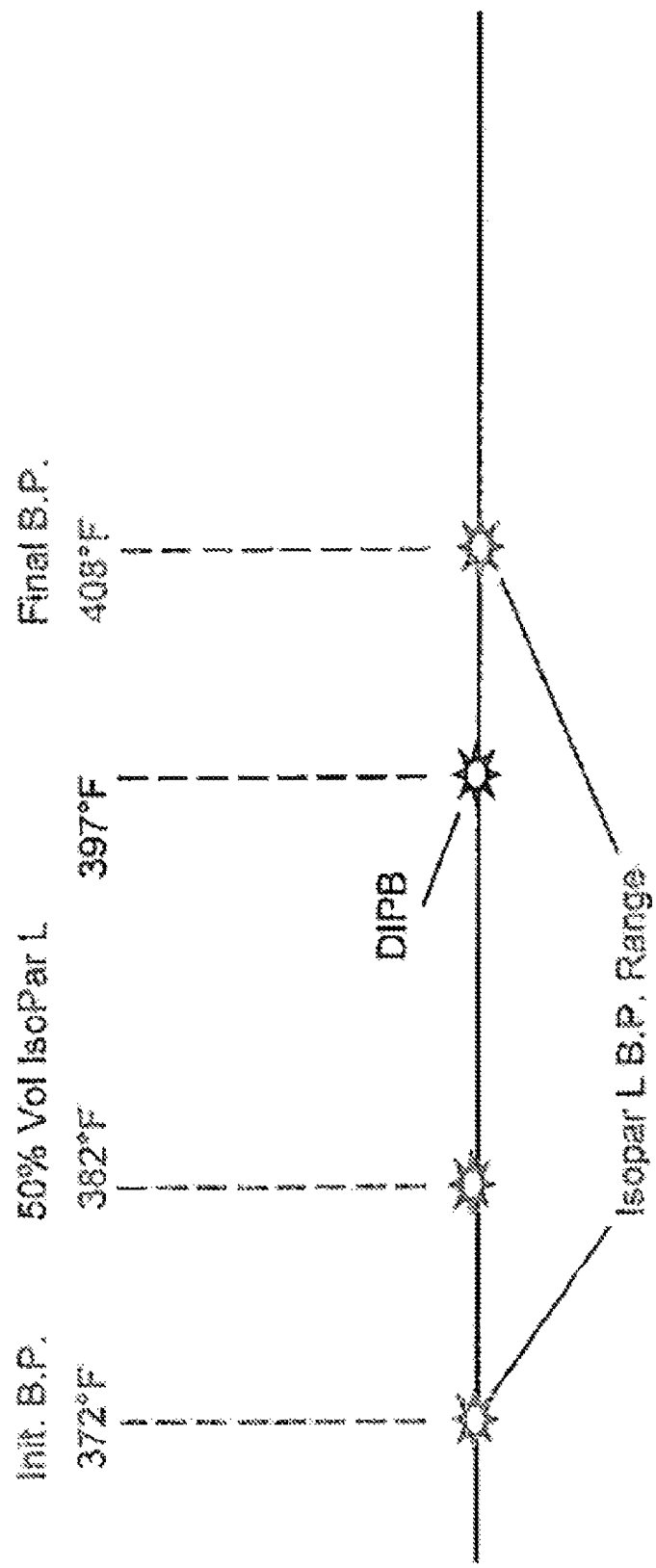

Exemplary properties of the individual components of the platewash compositions from Table 1 are shown in Table 2 below. A component analysis of the boiling points is illustrated in FIG. 2A-I.

TABLE 2

| Component | B.P. Init. (° F.) | 50% Vol. (° F.) | B.P. Dry (° F.) |
|---|---|---|---|
| DIPB | 397 | 397 | 397 |
| 2-Ethylhexyl acetate | 396 | 396 | 396 |
| Benzyl Alcohol | 401 | 401 | 401 |
| D60 | 374 | 381 | 412 |
| GS190 | 378 | 393 | 419 |
| Isopar L | 372 | 382 | 408 |

3. Properties of Platewash Solutions

Figure 3A:
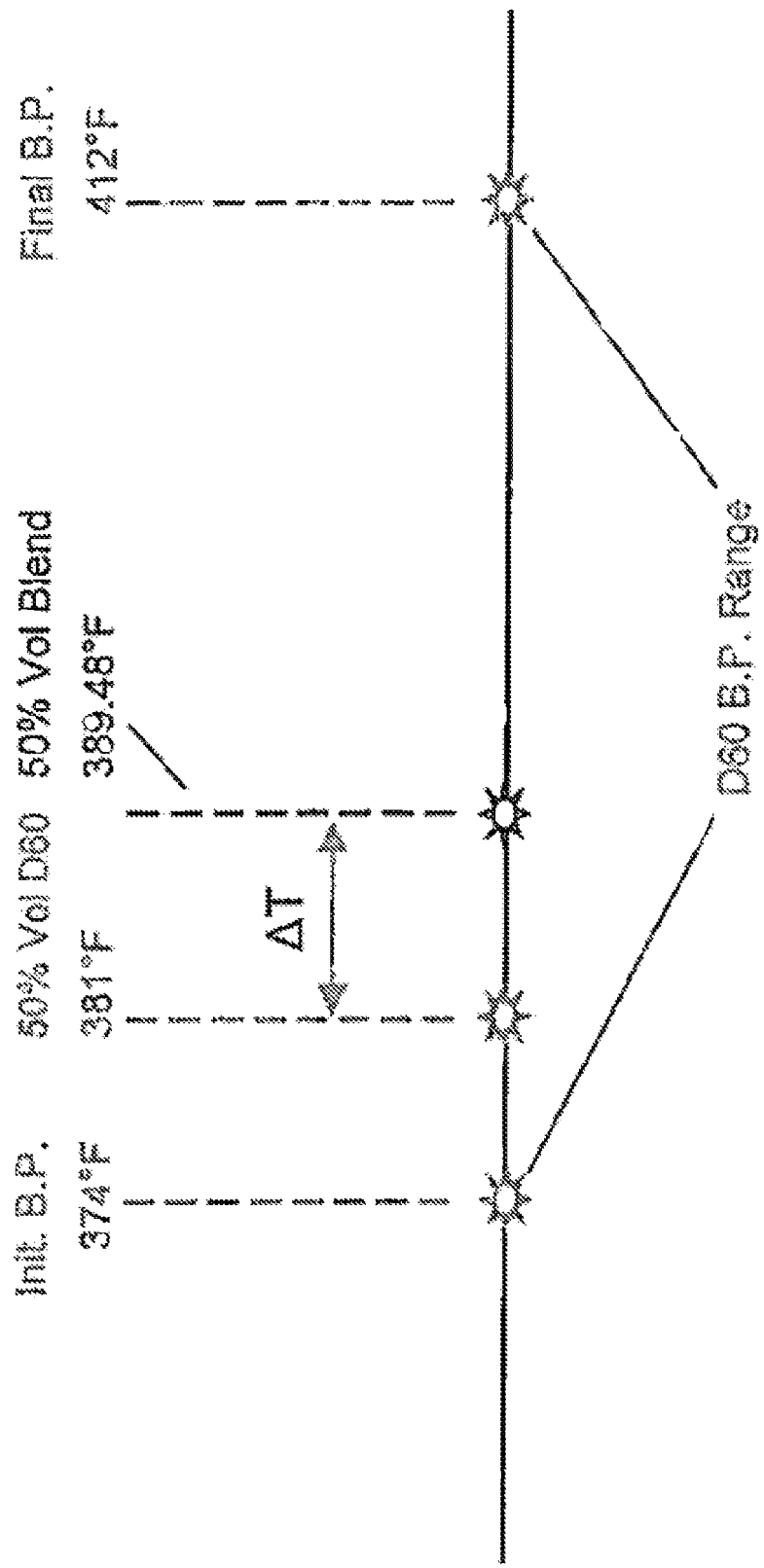
FIG. 3A-I show representative images illustrating a boiling point analysis including the 50% volume temperature of the blend based on the blended solution of formulations nos. 1-9, respectively.
Figure 3B:
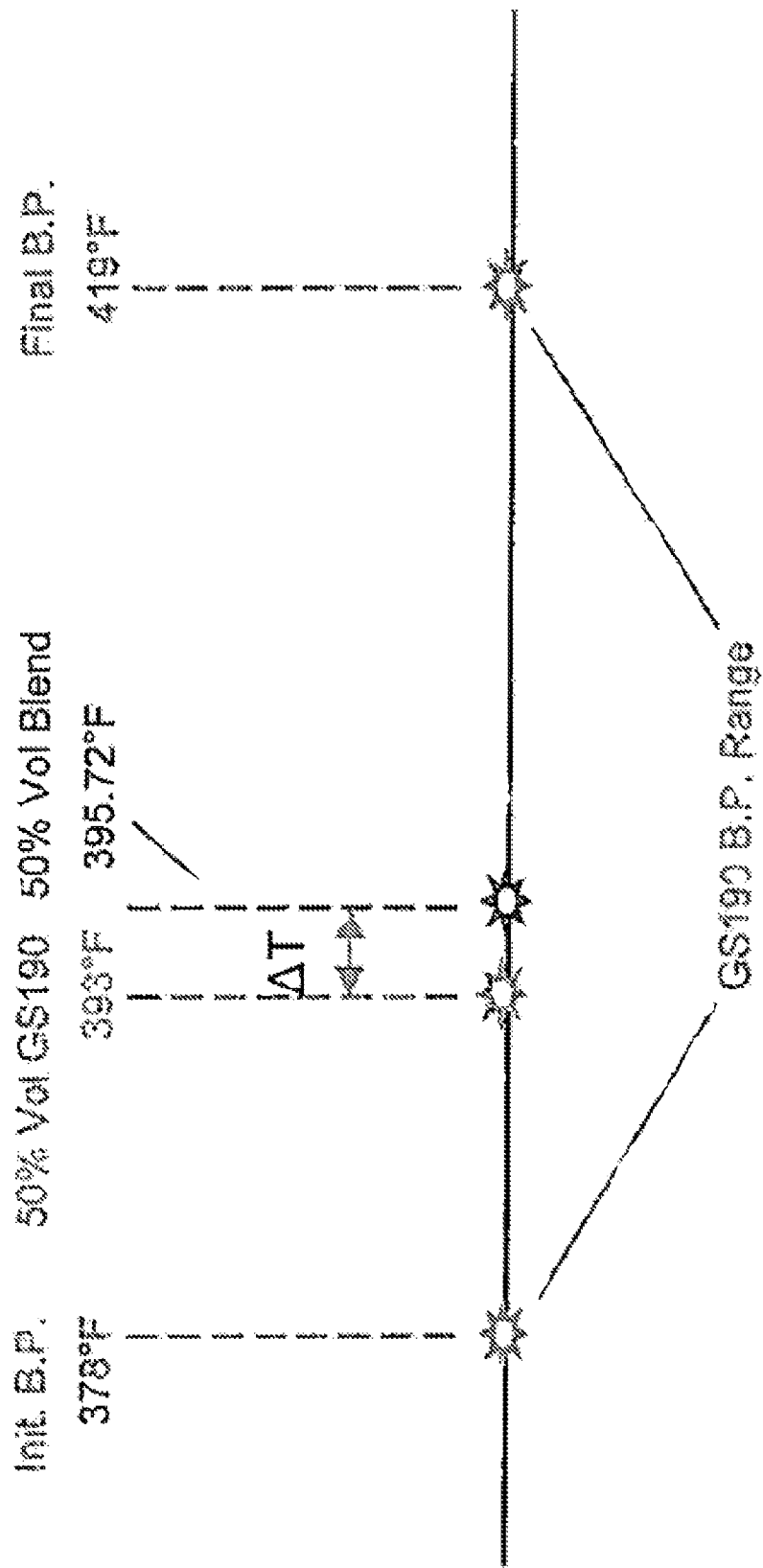
Figure 3C:
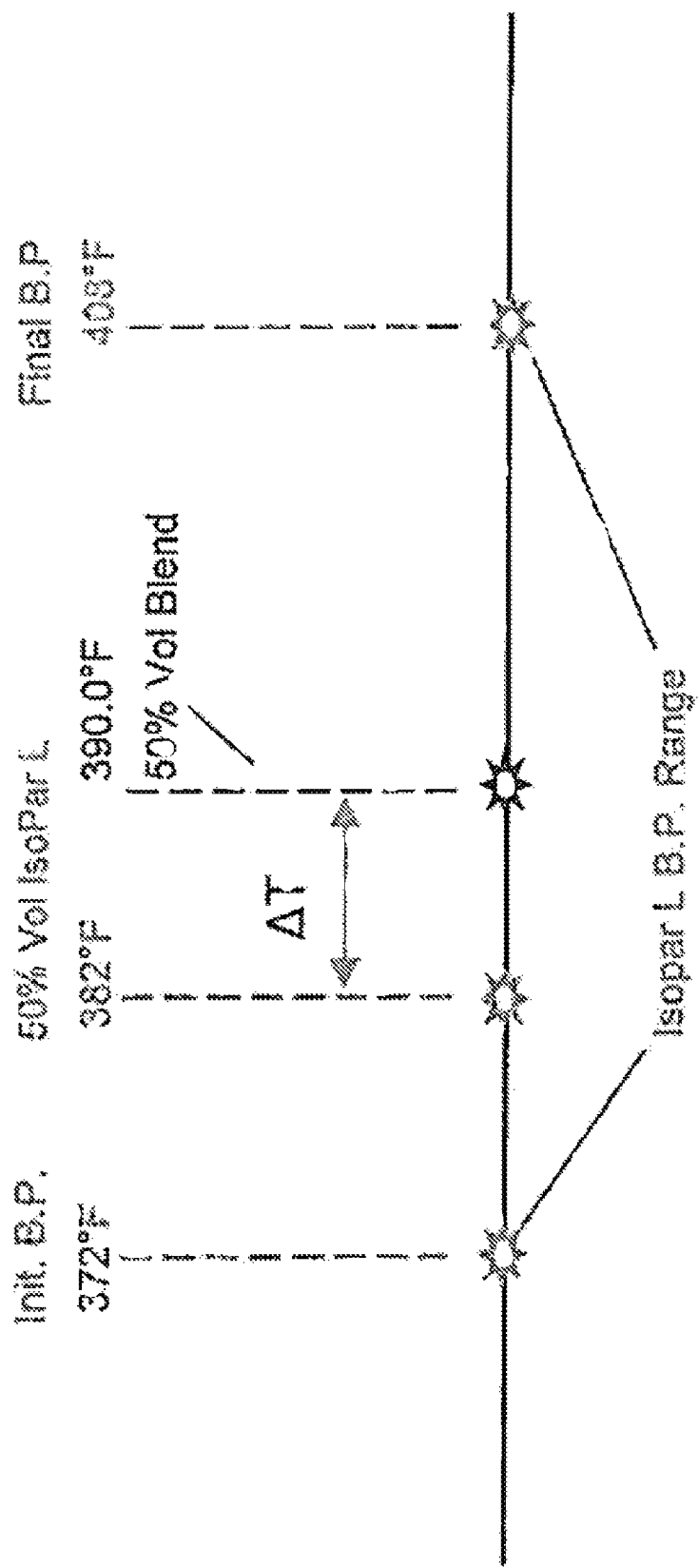
Figure 3D:
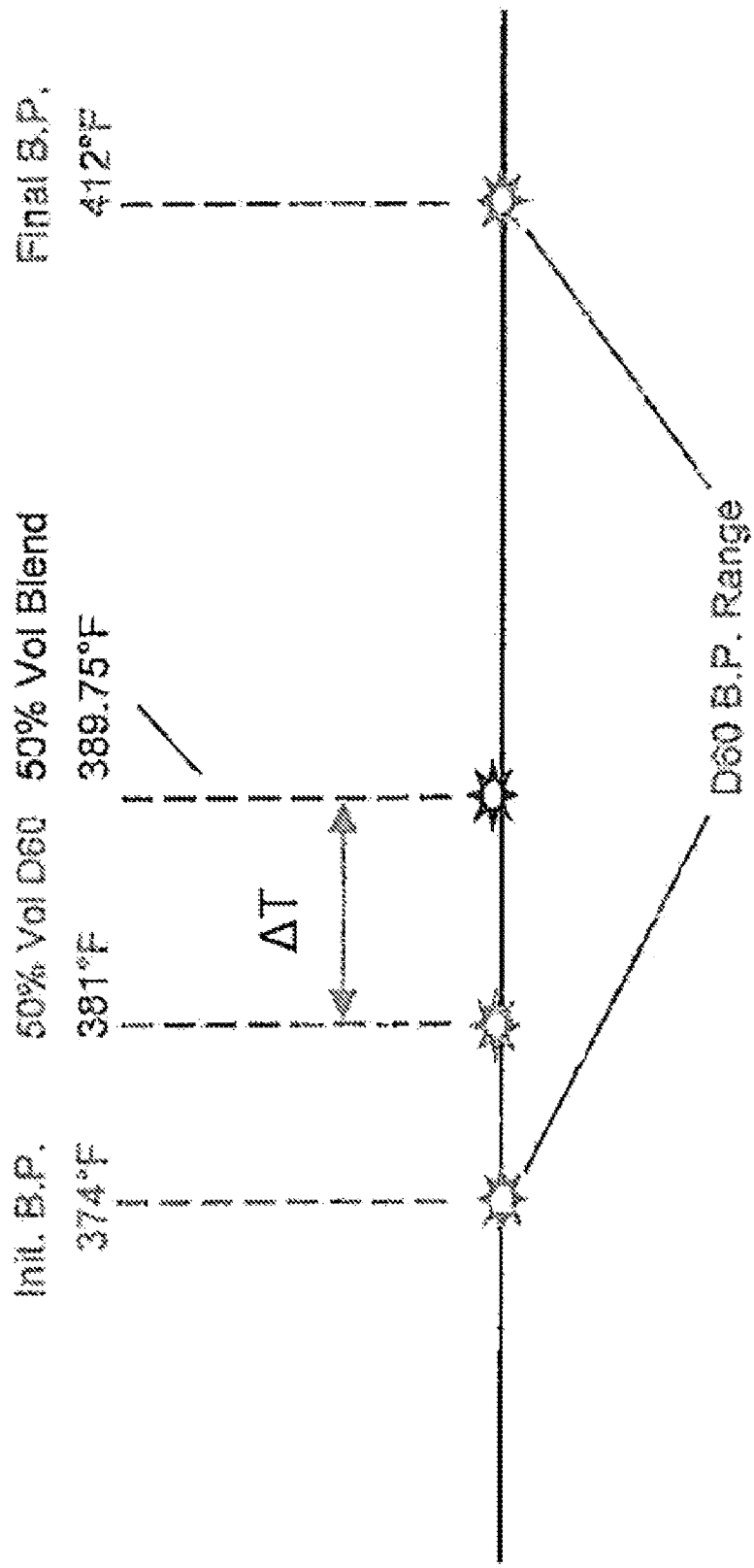
Figure 3E:
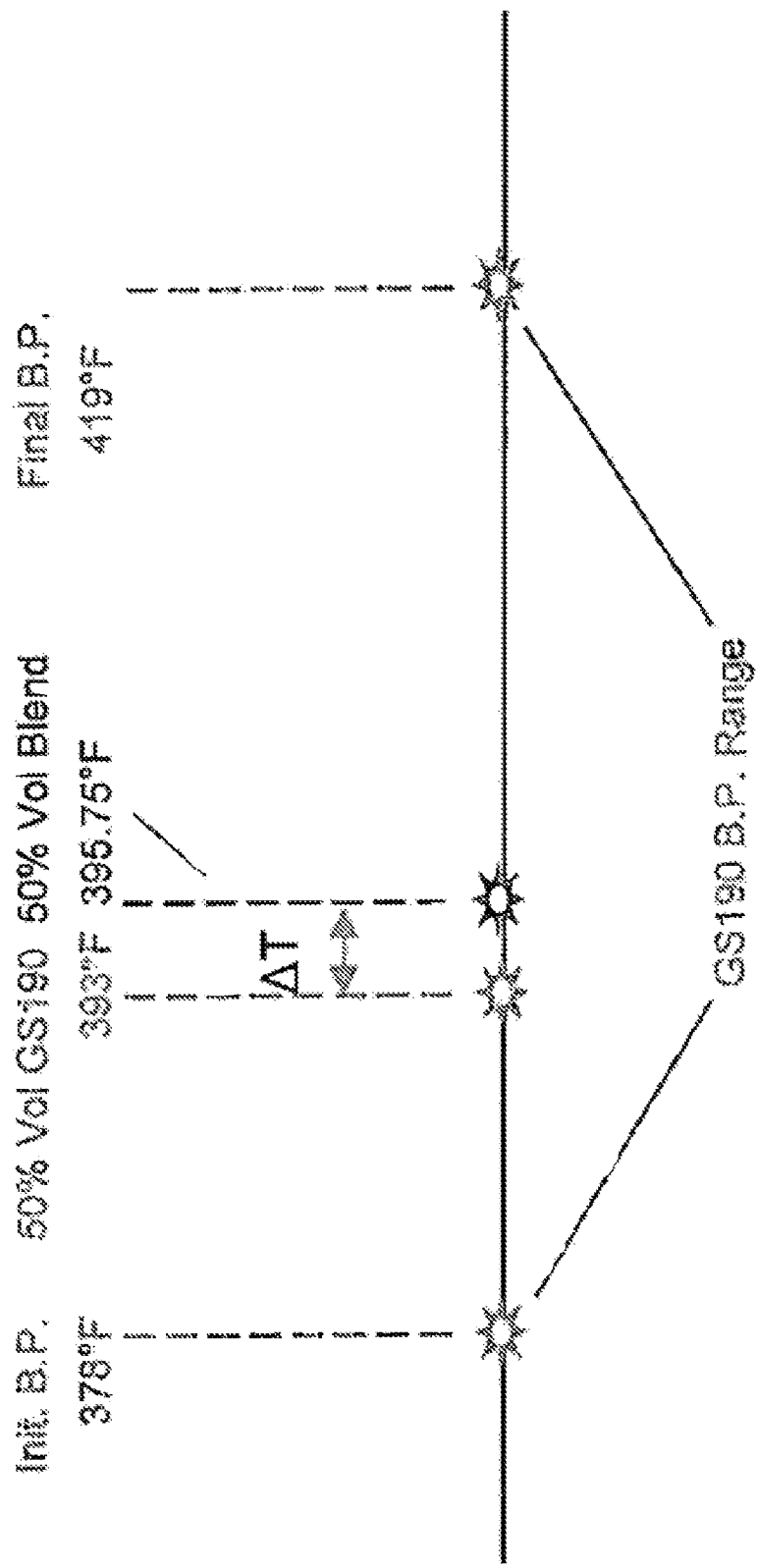
Figure 3F:
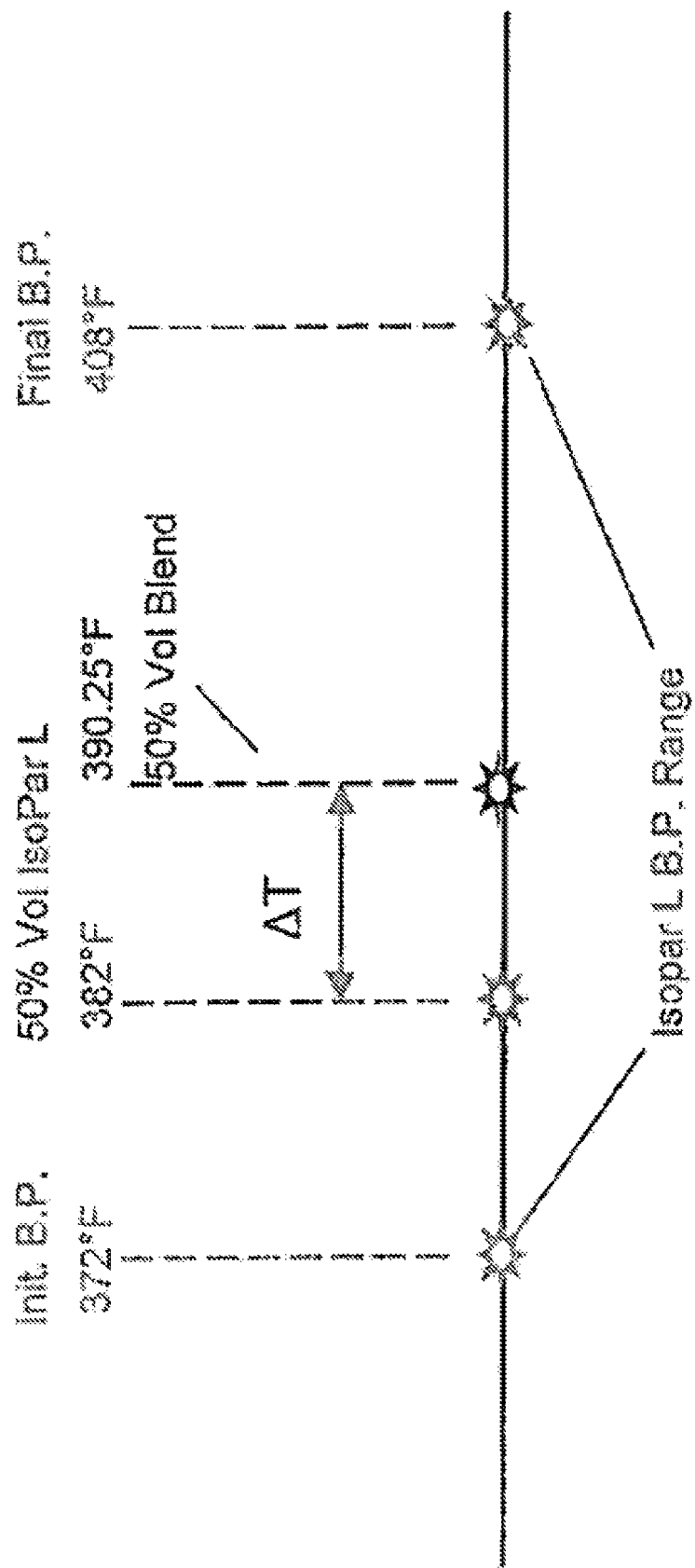
Figure 3G:
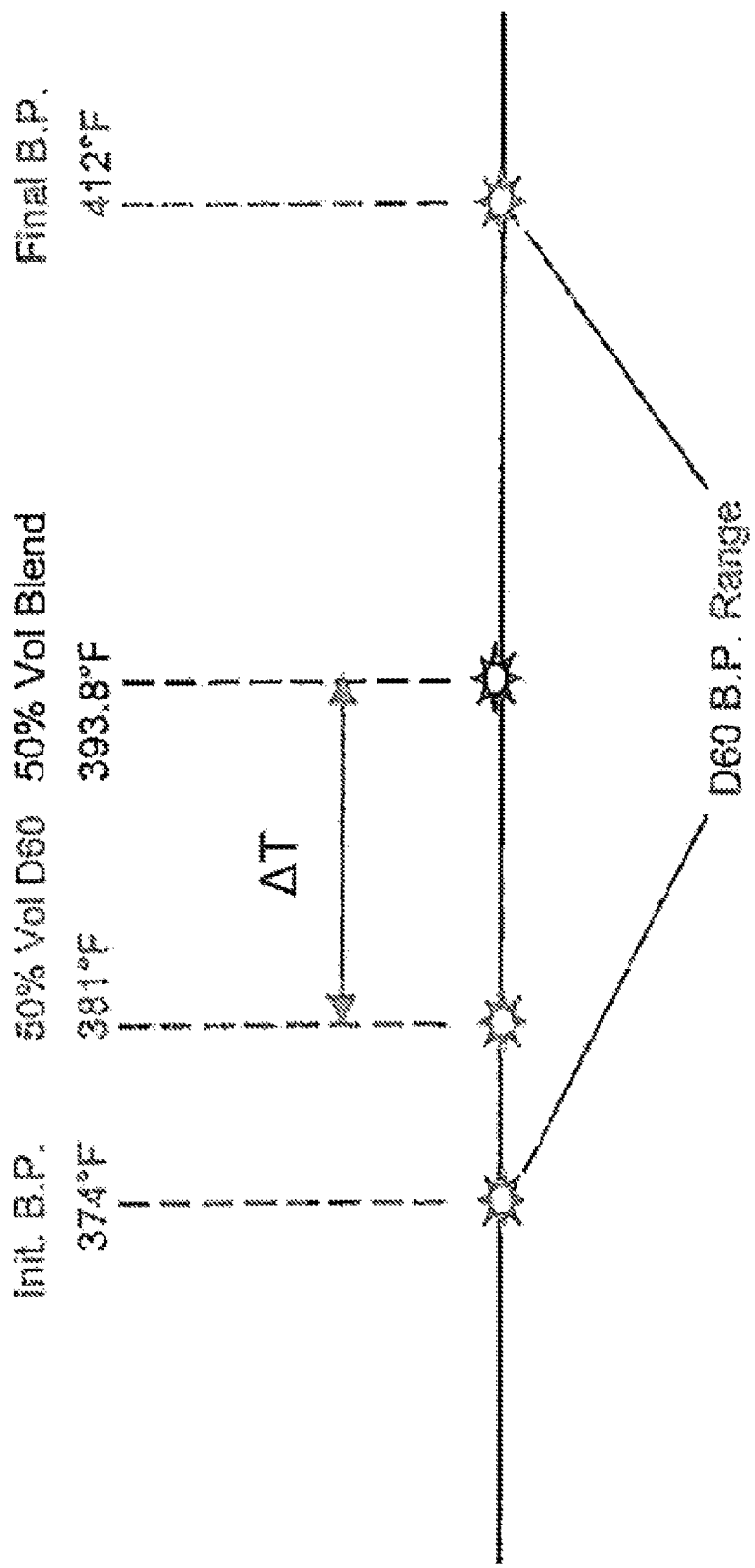
Figure 3H:
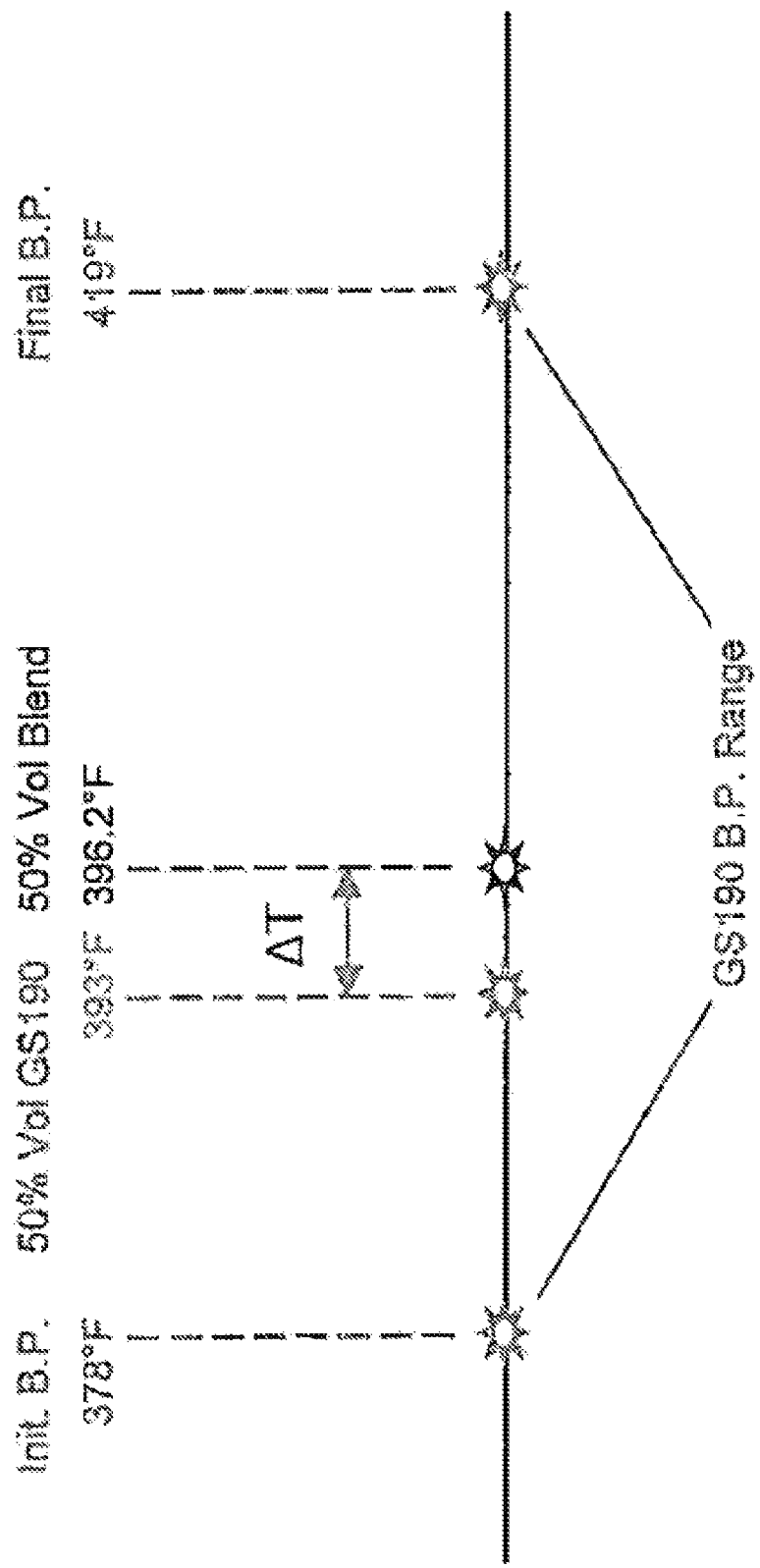
Figure 3I:
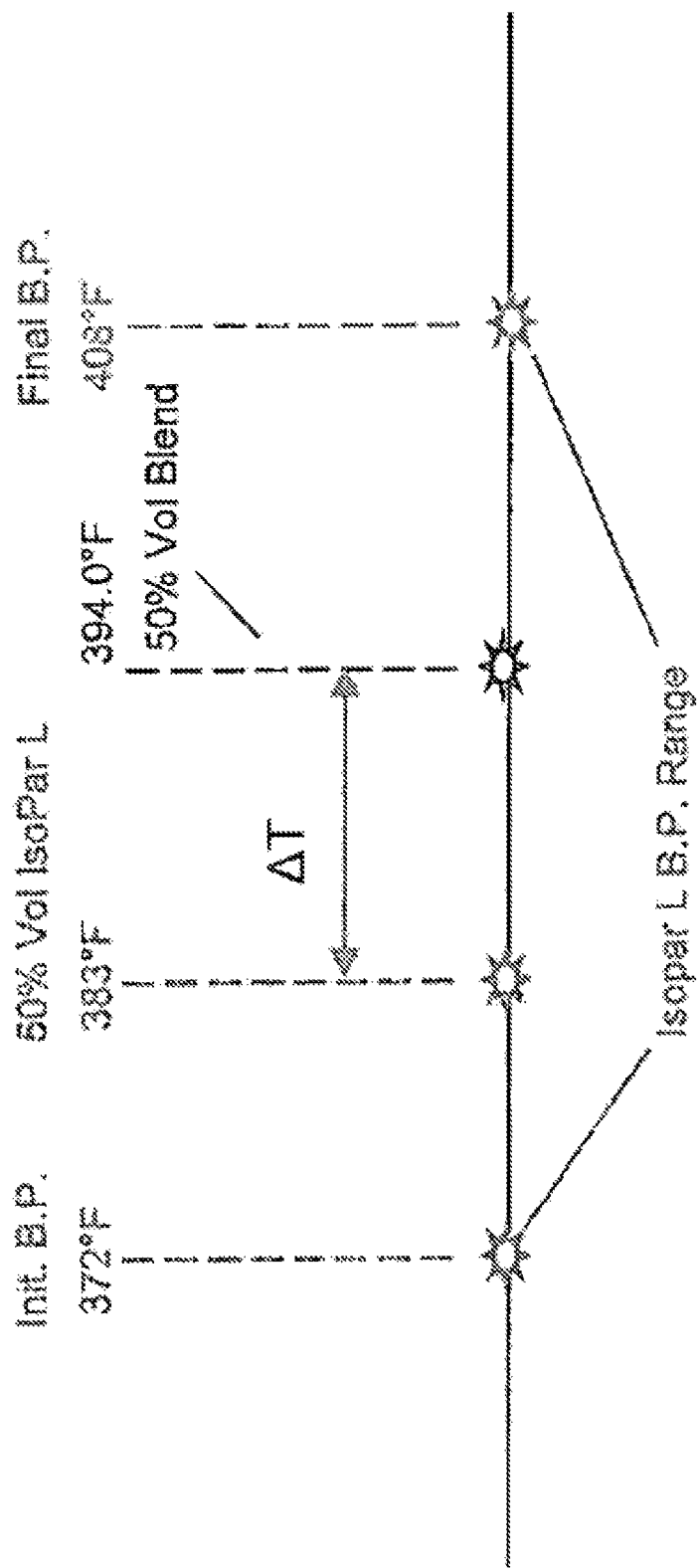
Figure 4A:
FIG. 4A-D show representative gas chromatogram traces of D60 (4A), LPA142 (4B), Isopar L (4C), and GS190 (4D).
Figure 4B:
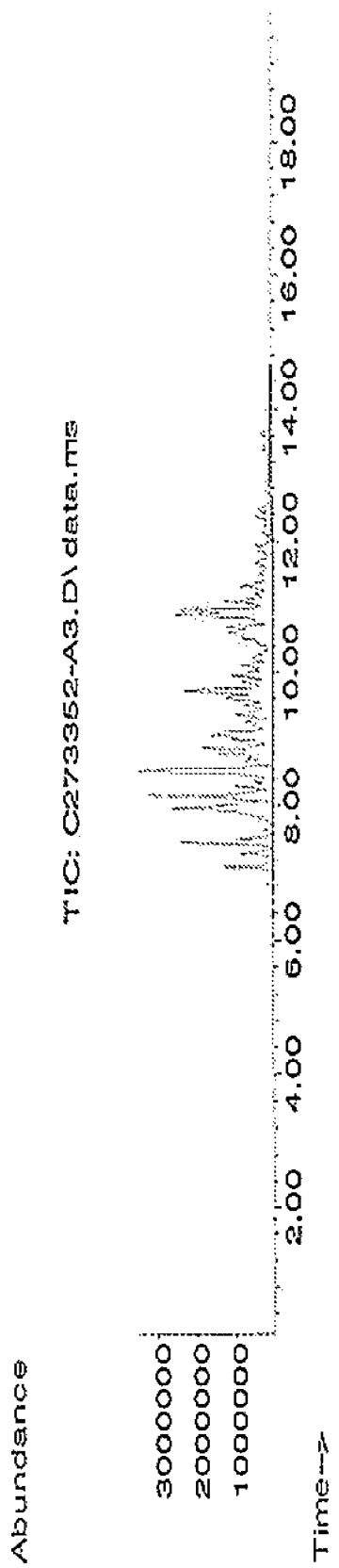
Figure 4C:
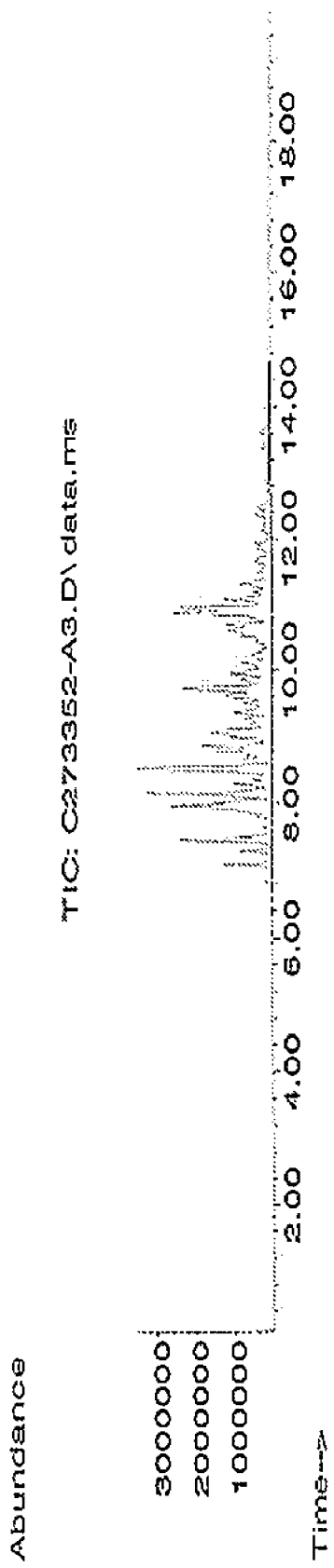
Figure 4D:
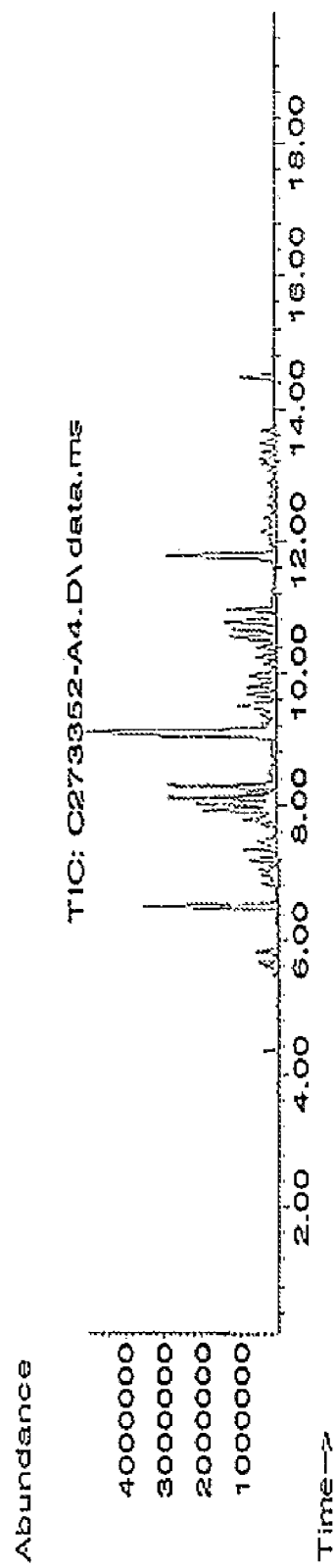

Exemplary properties of the platewash compositions nos. 1-9 from Table 1 are shown in Table 3 below. A blend analysis of the boiling points is illustrated in FIG. 3A-I.

TABLE 3

| No. | Hydrocarbon solvent 50% Vol. Temp. (° F.) | Blend 50% Vol. Temp. (° F.) | ΔT in ° F. (50% Hydrocarbon Vol. vs. 50% Blend Vol.) |
|---|---|---|---|
| 1 | 381.00 | 389.48 | 8.48 |
| 2 | 393.00 | 395.72 | 2.72 |
| 3 | 382.00 | 390.00 | 8.00 |
| 4 | 381.00 | 389.75 | 8.75 |
| 5 | 393.00 | 395.75 | 2.75 |
| 6 | 382.00 | 390.25 | 8.25 |
| 7 | 381.00 | 393.80 | 12.80 |
| 8 | 393.00 | 396.20 | 3.20 |
| 9 | 382.00 | 394.00 | 12.00 |

It will be apparent to those skilled in the art that various modifications and variations can be made in the present invention without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A composition consisting essentially of:
   (a) a hydrocarbon solvent consisting essentially of paraffinic components and having an average boiling point of from about 190° C. to about 230° C., and wherein the hydrocarbon solvent is present in an amount of from about 20 wt % to about 30 wt %, based on the total weight of the composition;
   (b) 2-ethylhexyl acetate in an amount of from about 20 wt % to about 80 wt %, based on the total weight of the composition; and
   (c) a co-solvent selected from tetrahydrofurfuryl alcohol, 2-ethoxyethanol, terpineol, dipropylene glycol methyl ether, 2-butoxyethanol, 2-(2-butyoxyethoxy) ethanol, benzyl alcohol, cyclohexanol, methyl cyclohexanol, hexyl alcohol, and heptyl alcohol, wherein the co-solvent is present in an amount of less than about 35 wt % but not less than about 1 wt %, based on the total weight of the composition.

2. The composition of claim 1, wherein the composition consists essentially of the hydrocarbon solvent, 2-ethylhexyl acetate, and the co-solvent.

3. The composition of claim 1, wherein the co-solvent is selected from cyclohexanol and benzyl alcohol.

4. The composition of claim 1, wherein 2-ethylhexyl acetate is present in an amount of about 25 wt %, based on the total weight of the composition.

5. The composition of claim 1, wherein the hydrocarbon solvent comprises C8-C26 branched and linear alkanes.

6. The composition of claim 1, wherein the hydrocarbon solvent is produced by gas to liquid (GTL) technology.

7. The composition of claim 1, wherein the co-solvent comprises an alcohol.

8. The composition of claim 7, wherein the alcohol is benzyl alcohol.

9. The composition of claim 7, wherein the composition consists essentially of the alcohol, 2-ethylhexyl acetate, and the hydrocarbon solvent.

10. The composition of claim 1, wherein the composition consists essentially of benzyl alcohol, 2-ethylhexyl acetate, and the hydrocarbon solvent.

11. A composition comprising:
   (a) a hydrocarbon solvent, wherein the hydrocarbon solvent is present in an amount of from about 20 wt % to about 30 wt %, based on the total weight of the composition;
   (b) 2-ethylhexylacetate, and
   (c) a co-solvent selected from tetrahydrofurfuryl alcohol, 2-ethoxyethanol, terpineol, dipropylene glycol methyl ether, 2-butoxyethanol, 2-(2-butyoxyethoxy) ethanol, benzyl alcohol, cyclohexanol, methyl cyclohexanol, hexyl alcohol, and heptyl alcohol,
   wherein the composition does not contain diisopropylbenzene.

12. The composition of claim 11, wherein the composition consists essentially of the co-solvent, 2-ethylhexyl acetate, and the hydrocarbon solvent.

13. The composition of claim 11, wherein the hydrocarbon solvent consists essentially of paraffinic components and having an average boiling point of from about 190° C. to about 230° C.

14. The composition of claim 11, wherein the co-solvent is benzyl alcohol.

15. The composition of claim 11, wherein the composition consists essentially of benzyl alcohol, 2-ethylhexyl acetate, and the hydrocarbon solvent.

* * * * *